(12) United States Patent
Lee et al.

(10) Patent No.: US 12,347,477 B2
(45) Date of Patent: Jul. 1, 2025

(54) INTEGRATED CIRCUIT MEMORY DEVICES HAVING EFFICIENT ROW HAMMER MANAGEMENT AND MEMORY SYSTEMS INCLUDING THE SAME

(71) Applicant: Samsung Electronics Co., Ltd., Suwon-si (KR)

(72) Inventors: Myungkyu Lee, Suwon-si (KR); Eunae Lee, Suwon-si (KR); Sunghye Cho, Suwon-si (KR); Kyomin Sohn, Suwon-si (KR); Kijun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 123 days.

(21) Appl. No.: 18/327,335

(22) Filed: Jun. 1, 2023

(65) Prior Publication Data

US 2024/0135980 A1 Apr. 25, 2024
US 2024/0233798 A9 Jul. 11, 2024

(30) Foreign Application Priority Data

Oct. 25, 2022 (KR) .................. 10-2022-0137939

(51) Int. Cl.
*G11C 11/406* (2006.01)
*G06F 12/02* (2006.01)
*G11C 11/408* (2006.01)

(52) U.S. Cl.
CPC ........ *G11C 11/406* (2013.01); *G06F 12/0223* (2013.01); *G11C 11/40603* (2013.01);
(Continued)

(58) Field of Classification Search
CPC ............ G11C 11/406; G11C 11/40603; G11C 11/40611; G11C 11/40615; G11C 11/40618; G11C 11/408; G06F 12/0223
(Continued)

(56) References Cited

U.S. PATENT DOCUMENTS 10,529,405 B2 1/2020 Lee et al.
11,158,364 B2 10/2021 Penney et al.
(Continued)

FOREIGN PATENT DOCUMENTS

KR 102385443 B1 4/2022

OTHER PUBLICATIONS

Kim et al. "Flipping Bits in Memory Without Accessing Them: An Experimental Study of DRAM Disturbance Errors" 2014 ACM/IEEE 41st International Symposium on Computer Architecture (Jun. 2014).

*Primary Examiner* — Ly D Pham
(74) *Attorney, Agent, or Firm* — Myers Bigel, P.A.

(57) ABSTRACT

A semiconductor memory device includes a memory cell array with a plurality of rows of memory cells therein, and a row hammer management (RHM) circuit including a hammer address queue. The RHM circuit is configured to: (i) receive first access row addresses from an external memory controller during a reference time interval, (ii) store a first row address randomly selected from the first access row addresses and second row addresses consecutively received from the memory controller after selecting the first row address, in the hammer address queue as candidate hammer addresses, and (iii) sequentially output the candidate hammer addresses as a hammer address. A refresh control circuit is provided to receive the hammer address and to perform a hammer refresh operation on one or more victim memory cell rows, which are physically adjacent to a memory cell row corresponding to the hammer address.

20 Claims, 32 Drawing Sheets

(52) U.S. Cl.
CPC ... *G11C 11/40611* (2013.01); *G11C 11/40615* (2013.01); *G11C 11/40618* (2013.01); *G11C 11/408* (2013.01)

(58) Field of Classification Search
USPC .......................................................... 365/222
See application file for complete search history.

(56) References Cited

U.S. PATENT DOCUMENTS

| | | |
|---|---|---|
| 11,386,946 B2 | 7/2022 | Ayyapureddi et al. |
| 11,398,265 B2 | 7/2022 | Wu et al. |
| 2019/0348107 A1* | 11/2019 | Shin .................. G11C 11/40622 |
| 2020/0402569 A1* | 12/2020 | He .................... G11C 11/40626 |
| 2022/0122652 A1 | 4/2022 | Brandl et al. |
| 2022/0188015 A1 | 6/2022 | Kim et al. |
| 2023/0141789 A1* | 5/2023 | Cho .................... G11C 11/4093 365/222 |
| 2023/0154522 A1* | 5/2023 | Kim ...................... G06F 7/5443 365/222 |
| 2023/0221869 A1* | 7/2023 | Cho ................. G11C 11/40615 711/154 |
| 2023/0326511 A1* | 10/2023 | Oh ...................... G11C 11/4063 365/222 |
| 2024/0038291 A1* | 2/2024 | Gieske ................ G11C 11/4078 |
| 2024/0135980 A1* | 4/2024 | Lee .................. G11C 11/40603 |

* cited by examiner

FIG. 23

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
|  | H | R4 | R5 | R6 | R7 | R8 | R9 | R10 | R11 | R12 | R13 | R14 | R15 | R16 | CID3/R17 |
| WR | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | H | L | V | CID3 |
| RD | L | H | L | H | H | L | BL | BA0 | BA1 | BG0 | BG1 | BG2 | CID0 | CID1 | CID2 |
|  | H | C2 | C3 | C4 | C5 | C6 | C7 | C8 | C9 | C10 | V | H | V | V | CID3 |

FIG. 24

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | L | CID3 | BA0 | BA1 | BG0 | BG1 | BG2 | CID0 | CID1 | CID2 |

# INTEGRATED CIRCUIT MEMORY DEVICES HAVING EFFICIENT ROW HAMMER MANAGEMENT AND MEMORY SYSTEMS INCLUDING THE SAME

REFERENCE TO PRIORITY APPLICATION

This application claims priority under 35 U.S.C. § 119 to Korean Patent Application No. 10-2022-0137939, filed Oct. 25, 2022, the disclosure of which is hereby incorporated herein by reference.

BACKGROUND

The present disclosure relates to memories and, more particularly, to integrated circuit memory devices that defend against row hammer attacks and memory systems including the same.

A semiconductor memory device may typically be classified as a volatile memory device or a nonvolatile memory device. A volatile memory device refers to a memory device that loses data stored therein at power-off. One volatile memory device, known as a dynamic random access memory (DRAM), may be used in various devices such as mobile systems, servers, and graphic devices.

In volatile memory devices, such as dynamic random access memory (DRAM) devices, cell charges stored in a memory cell may be lost in response to leakage currents. In addition, when a word-line is transitioned frequently between an active state and a precharged state (i.e., when the word-line has been accessed intensively or frequently), an affected memory cell connected to a word-line that is adjacent to the frequently accessed word-line may lose stored charges. As will be understood by those skilled in the art, charges stored in a memory cell may be maintained by recharging the cell before data is lost from leakage of cell charges. Such recharging of cells is typically referred to as a refresh operation, and a refresh operation may be performed repeatedly before cell charges are significantly lost.

SUMMARY

Example embodiments may provide integrated circuit memory devices and memory systems capable of managing row hammer events using enhanced refresh management command.

According to example embodiments, a memory device includes a memory cell array, a row hammer management circuit and a refresh control circuit. The memory cell array includes a plurality of memory cell rows, and each of the plurality of memory cell rows includes a plurality of memory cells. The row hammer management circuit includes a hammer address queue, receives first access row addresses from an external memory controller during a reference time interval, stores a first row address randomly selected from the first access row addresses in the hammer address queue as a first candidate hammer address, stores a second row address received from the memory controller in the hammer address queue as a second candidate hammer address, in response to receiving a refresh management command from the memory controller, and sequentially outputs candidate hammer addresses including the first candidate hammer address and the second candidate hammer address as a hammer address. The refresh control circuit receives the hammer address and performs a hammer refresh operation on one or more victim memory cell rows which are physically adjacent to a memory cell row corresponding to the hammer address at at least a portion of first refresh timings, based on a refresh command, and at a second refresh timing based on the refresh management command.

According to additional embodiments, a semiconductor memory device includes a memory cell array, a row hammer management circuit and a refresh control circuit. The memory cell array includes a plurality of memory cell rows and each of the plurality of memory cell rows includes a plurality of memory cells. The row hammer management circuit includes a hammer address queue, receives first access row addresses from an external memory controller during a reference time interval, stores a first row address randomly selected from the first access row addresses and second row addresses consecutively received from the memory controller after selecting the first row address, in the hammer address queue as candidate hammer addresses, and sequentially outputs the candidate hammer addresses as a hammer address. The refresh control circuit receives the hammer address and performs a hammer refresh operation on one or more victim memory cell rows which are physically adjacent to a memory cell row corresponding to the hammer address at at least a portion of first refresh timings, based on a refresh command, and at a second refresh timing based on a refresh management command received from the memory controller subsequent to the reference time interval.

According to further embodiments, a memory system includes a semiconductor memory device and a memory controller to control the semiconductor memory device. The semiconductor memory device includes a memory cell array, a row hammer management circuit and a refresh control circuit. The memory cell array includes a plurality of memory cell rows and each of the plurality of memory cell rows includes a plurality of memory cells. The row hammer management circuit includes a hammer address queue, receives first access row addresses from an external memory controller during a reference time interval, stores a first row address randomly selected from the first access row addresses in the hammer address queue as a first candidate hammer address, stores a second row address received from the memory controller in the hammer address queue as a second candidate hammer address in response to receiving a refresh management command from the memory controller, and sequentially outputs candidate hammer addresses including the first candidate hammer address and the second candidate hammer address as a hammer address. The refresh control circuit receives the hammer address and performs a hammer refresh operation on one or more victim memory cell rows which are physically adjacent to a memory cell row corresponding to the hammer address. The reference time interval corresponds to a refresh interval between refresh cycles of the semiconductor memory device. The row hammer management circuit selects one of the first access row addresses as the first row address in response to a first set of a random binary code matching a second set of a reference binary code.

The semiconductor memory devices and the memory systems according to example embodiments performs hammer refresh operations based on random picks, and forcibly capture a row address received from the memory controller right after receiving the refresh management command, or before receiving the refresh management command, to thereby store the captured row address in the hammer address queue. Accordingly, the semiconductor memory devices and memory systems according to example embodiments may prevent the hammer address queue from being empty and thus may enhance strength of defending against row hammer attacks.

BRIEF DESCRIPTION OF THE DRAWINGS

Example embodiments of the present disclosure will be described below in more detail with reference to the accompanying drawings.

FIGS. 23 and 24 illustrate example commands which may be used in the memory system of FIG. 1.

DETAILED DESCRIPTION

Various example embodiments of the present disclosure will be described more fully hereinafter with reference to the accompanying drawings, in which example embodiments are shown.

Figure 1:
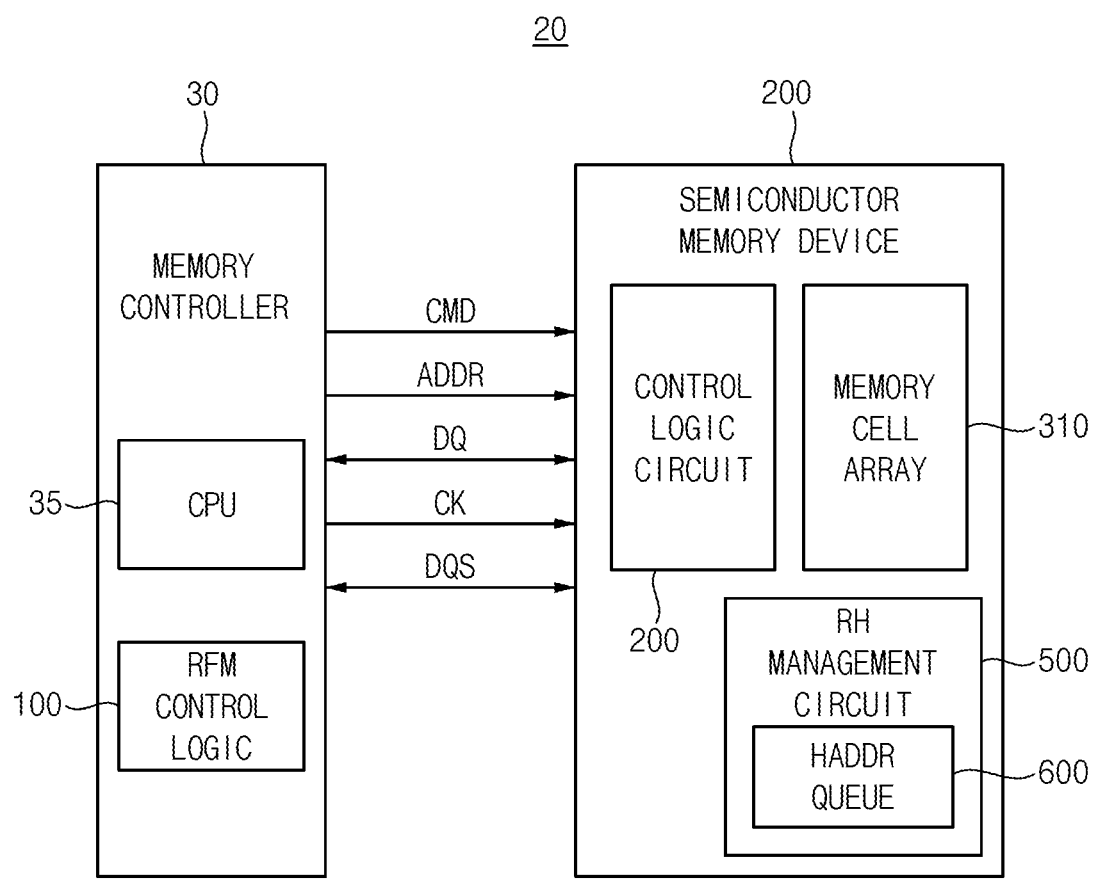
FIG. 1 is a block diagram illustrating a memory system according to example embodiments.

Referring now to FIG. 1, a memory system 20 according to example embodiments may include a memory controller 30 and a semiconductor memory device 200. The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR5) synchronous DRAM (SDRAM), a DDR6 SDRAM or the like.

The memory controller 30 may transmit a clock signal CK (the clock signal CK may be referred to a command clock signal), a command CMD, and an address (signal) ADDR to the semiconductor memory device 200. Herein, for convenience of description, the terms of a clock signal CK, a command CMD, and an address ADDR and the terms of clock signals CK, commands CMD, and addresses ADDR may be used interchangeably. The memory controller 30 may transmit a data strobe signal DQS to the semiconductor memory device 200 when the memory controller 30 writes data DQ in the semiconductor memory device 200. The semiconductor memory device 200 may also transmit a data strobe signal DQS to the memory controller 30 when the memory controller 30 reads data DQ from the semiconductor memory device 200. The address ADDR may be accompanied by the command CMD and the address ADDR may be referred to as an access address.

The memory controller 30 may include a central processing unit (CPU) 35 that controls overall operation of the memory controller 30 and a refresh management (RFM) control logic 100 that generates a refresh management command associated with a row hammer of the plurality of memory cell rows of the semiconductor memory device 200. The semiconductor memory device 200 may also include a memory cell array 310 that stores the data DQ, a control logic circuit 210 and a row hammer (RH) management circuit 500.

The control logic circuit 210 may control operations of the semiconductor memory device 200. The memory cell array 310 may include a plurality of memory cell rows and each of the memory cell rows may include a plurality of (volatile) memory cells. Each memory cell MC may be connected to a corresponding word-line WL and a corresponding bit-line BL.

The row hammer management circuit 500 may include a hammer address (HADDR) queue 600. The row hammer management circuit 500 may receive first access row addresses from the memory controller 30 during a reference time interval, may store a first row address randomly selected from the first access row addresses in the hammer address queue 600 as a first candidate hammer address, may store a second row address received from the memory controller 30 in the hammer address queue 600 as a second candidate hammer address in response to receiving the refresh management command from the memory controller 30 and may sequentially output candidate hammer addresses including the first candidate hammer address and the second candidate hammer address as a hammer address.

The reference time interval may correspond to a refresh interval between refresh cycles of the semiconductor memory device 200 and the semiconductor memory device 200 may perform a refresh operation on one of the plurality of memory cell rows during one of the refresh cycles.

In some embodiments, the row hammer management circuit 500 may receive first access row addresses from the memory controller 30 during the reference time interval. may store a first row address randomly selected from the first access row addresses and second row addresses consecutively received from the memory controller 30 after the first row address in the hammer address queue 600 as candidate hammer addresses, and may sequentially output the candidate hammer addresses as a hammer address.

In response to a first command such as a precharge command applied after the active command, the row hammer management circuit 500 may perform an internal read-update-write operation, to read the count data from a target memory cell row from among the plurality of memory cell rows, then update the read count data, and then write the updated count data in the target memory cell row. The control logic circuit 210 may control access on the memory cell array 310 and may control the row hammer management circuit 500.

The semiconductor memory device 200 performs a refresh operation periodically to protect data, which may be disrupted by charge leakage from the memory cells storing data. Due to a scale down of the manufacturing process of the semiconductor memory device 200, the storage capacitance of the memory cell is decreased and the refresh period is shortened (i.e., refresh frequency is increased). The refresh period is further shortened because the total refresh time is typically increased as the memory capacity of the semiconductor memory device 200 is increased.

To compensate for degradation of adjacent memory cells due to the intensive access to a particular row or a hammer address, a target row refresh (TRR) scheme was adopted and an in-memory refresh scheme was developed to reduce the burden of the memory controller. The memory controller is typically responsible for the hammer refresh operation in the TRR scheme and the semiconductor memory device is typically responsible for the hammer refresh operation in the in-memory refresh scheme.

The chip size overhead for the in-memory refresh may be serious as the memory capacity is increased and demands on low power consumption of the semiconductor memory device is increased. In addition, the power consumption may be increased because the semiconductor memory device has to care for the hammer refresh operations even though there is no intensive access. In addition, a row hammer may occur in memory cells due to irregular attack patterns.

In the semiconductor memory device 200 according to example embodiments, the row hammer management circuit 500 stores a second row address received from the memory controller 30 in the hammer address queue 600 as a second candidate hammer address in response to receiving the refresh management command from the memory controller, and may sequentially output the candidate hammer addresses as a hammer address and a refresh control circuit (400 in FIG. 3) may perform a hammer refresh operation on one or more victim memory cell rows which are physically adjacent to a memory cell row corresponding to the hammer address. Therefore, the semiconductor memory device 200 may prevent the hammer refresh operation from not being performed when the semiconductor memory device 200 receives the refresh management command.

Figure 2:
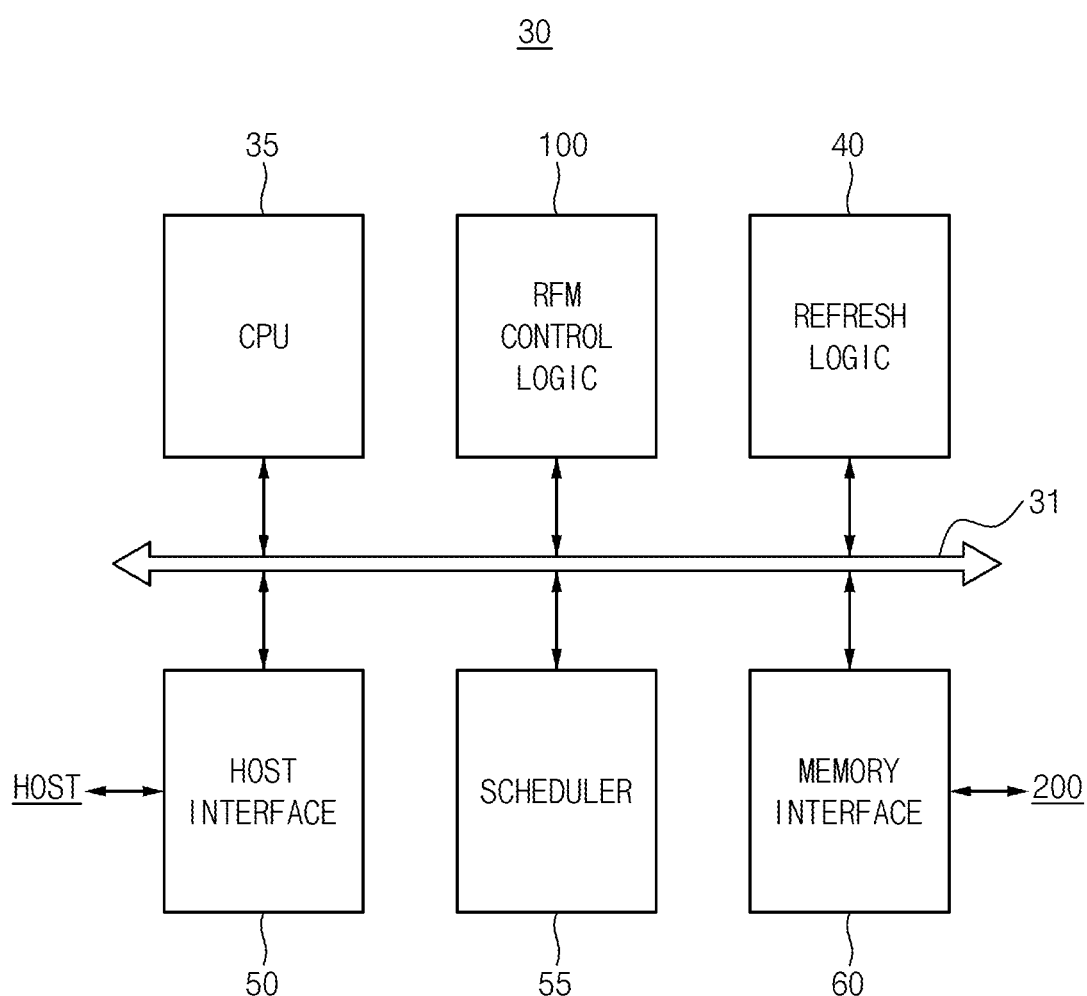
FIG. 2 is a block diagram illustrating the memory controller in FIG. 1 according to example embodiments.

FIG. 2 is a block diagram illustrating the memory controller in FIG. 1 according to example embodiments. Referring to FIG. 2, the memory controller 30 may include the CPU 35, the RFM control logic 100, a refresh logic 40, a host interface 50, a scheduler 55 and a memory interface 60 which are connected to each other through a bus 31. The CPU 35 may control overall operation of the memory controller 30. The CPU 35 may control the RFM control logic t 100, the refresh logic 40, the host interface 50, the scheduler 55 and the memory interface 60 through the bus 31. The refresh logic 40 may generate auto refresh command for refreshing memory cells of the plurality of memory cell rows based on a refresh interval of the semiconductor memory device 200. The host interface 50 may perform interfacing with a host. The memory interface 60 may perform interfacing with the semiconductor memory device 200. The scheduler 55 may manage scheduling and transmission of sequences of commands generated in the memory controller 30. The scheduler 55 may transmit an auto refresh command and the refresh management command to the semiconductor memory device 200 via the memory interface 60.

Figure 3:
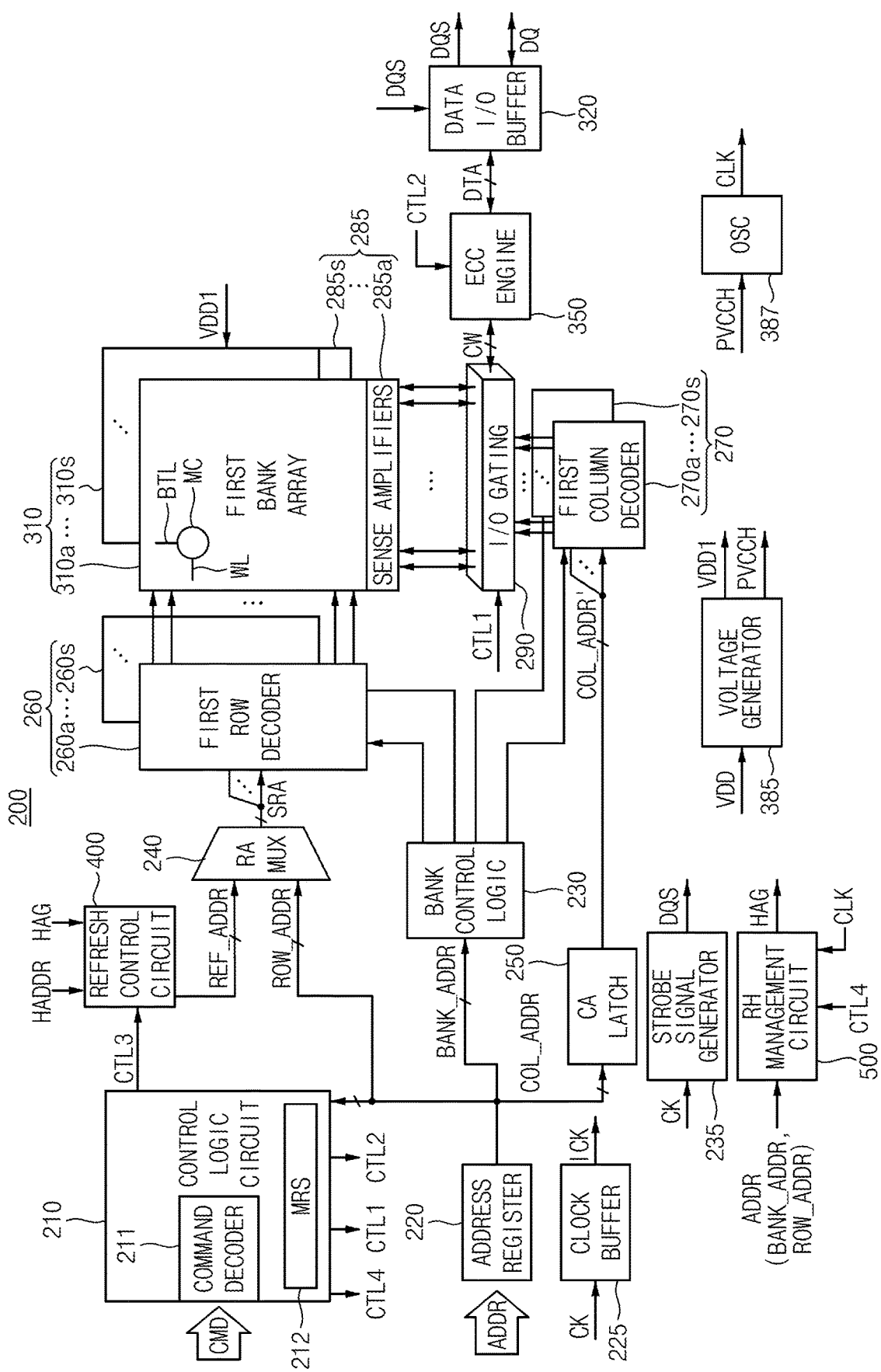
FIG. 3 is a block diagram illustrating an example of the semiconductor memory device in FIG. 1 according to example embodiments.

Referring now to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an input/output (I/O) gating circuit 290, an error correction code (ECC) engine 350, a clock buffer 225, a strobe signal generator 235, a voltage generator 385, an oscillator (OSC) 387, the row hammer management circuit 500 and a data I/O buffer 320.

The memory cell array 310 may include first through sixteenth bank arrays 310a~310s. Likewise, the row decoder 260 may include first through sixteenth row decoders 260a~260s respectively coupled to the first through sixteenth bank arrays 310a~310s, the column decoder 270 may include first through sixteenth column decoders 270a~270s respectively coupled to the first through sixteenth bank arrays 310a~310s, and the sense amplifier unit 285 may include first through sixteenth sense amplifiers 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s and first through sixteenth sense amplifiers 285a~285s may form first through sixteenth banks. Each of the first through sixteenth bank arrays 310a~310s includes a plurality of memory cells MC formed at intersections of a plurality of word-lines WL and a plurality of bit-lines BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. In response, one of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260s, which are shown collectively as 260 in FIG. 3.

The refresh control circuit 400 may sequentially increase or decrease the refresh row address REF_ADDR when operating in a normal refresh mode in response to a third control signal CTL3 from the control logic circuit 210. The refresh control circuit 400 may also receive a hammer address HADDR in a hammer refresh mode, and may output hammer refresh addresses designating one or more victim memory cell rows physically closely adjacent to a memory cell row corresponding to the hammer address as the refresh row address REF_ADDR.

The activated one of the first through sixteenth row decoders 260a~260s, by the bank control logic 230, may decode the row address SRA that is output from the row address multiplexer 240, and may activate a word-line corresponding to the row address SRA. For example, the activated bank row decoder applies a word-line driving voltage to the word-line corresponding to the row address. The column address latch 250 may receive the column address COL_ADDR from the address register 220, and may temporarily store the received column address COL_ADDR. In some embodiments, in a burst mode, the column address latch 250 may generate column addresses COL_ADDRs that increment from the received column address COL_ADDR. The column address latch 250 may apply the temporarily stored or generated column address COL_ADDRs to the first through sixteenth column decoders 270a~270s.

The activated one of the first through sixteenth column decoders 270a~270s activates a sense amplifier corresponding to the bank address BANK_ADDR and the column address COL_ADDR through the I/O gating circuit 290. In addition, the I/O gating circuit 290 may include a circuitry for gating input/output data, and may further include input data mask logic, read data latches for storing data that is output from the first through sixteenth bank arrays 310a~310s, and write drivers for writing data to the first through sixteenth bank arrays 310a~310s.

Codeword CW read from a selected one bank array of the first through sixteenth bank arrays 310a~310s is sensed by a sense amplifier coupled to the selected one bank array from which the data is to be read, and is stored in the read data latches. The codeword CW stored in the read data latches may be provided to the data I/O buffer 320 as data DTA after ECC decoding is performed on the codeword CW by the ECC engine 350. The data I/O buffer 320 may convert the data DTA into the data DQ and may transmit the data DQ along with the data strobe signal DQS to the memory controller 30.

The data DQ to be written in a selected one bank array of the first through sixteenth bank arrays 310a~310s may be provided to the data I/O buffer 320 from the memory controller 30. The data I/O buffer 320 may convert the data DQ to the data DTA and may provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may write the codeword CW in a sub-page in the selected one bank array through the write drivers.

The data I/O buffer 320 may provide the data DQ from the memory controller 30 to the ECC engine 350 by converting the data DQ to the data DTA in a write operation of the semiconductor memory device 200 and may convert the data DTA to the data DQ from the ECC engine 350 and may transmit the data DQ and the data strobe signal DQS to the memory controller 30 in a read operation of the semiconductor memory device 200.

The ECC engine 350 may perform an ECC encoding on the data DTA and may perform an ECC decoding on the codeword CW based on a second control signal CTL2 from the control logic circuit 210. The clock buffer 225 may receive the clock signal CK, may generate an internal clock signal ICK by buffering the clock signal CK, and may provide the internal clock signal ICK to circuit components processing the command CMD and the address ADDR. The strobe signal generator 235 may receive the clock signal CK, may generate the data strobe signal DQS based on the clock signal CK and may provide the data strobe signal DQS to the data I/O buffer 320.

The voltage generator 385 may generate an operating voltage VDD1 based on a power supply voltage VDD received from an outside device, may generate a power stabilizing signal PVCCH indicating that the power supply voltage VDD has reached a reference voltage level, may provide the operating voltage VDD1 to the memory cell array 310, and may provide the power stabilizing signal PVCCH to the oscillator 387.

The oscillator 387 may generate a clock signal CLK toggling periodically based on the power stabilizing signal PVCCH and may provide the clock signal CLK to the row hammer management circuit 500.

The row hammer management circuit 500 may receive the address ADDR (including the bank address BANK_ADDR and the row address ROW_ADDR). The row hammer management circuit 500 may receive first access row addresses from the memory controller 30 during a reference time interval, may store a first row address randomly selected from the first access row addresses in the hammer address queue 600 as a first candidate hammer address, may store a second row address received from the memory controller 30 in the hammer address queue 600 as a second candidate hammer address in response to receiving the refresh management command from the memory controller 30, and may sequentially output candidate hammer addresses including the first candidate hammer address and the second candidate hammer address as the hammer address HADDR to the refresh control circuit 400. In addition, the row hammer management circuit 500 may provide the refresh control circuit 400 with a hammer address generation signal HAG indicating the hammer address HADDR is output.

The control logic circuit 210 may control operations of the semiconductor memory device 200. For example, the control logic circuit 210 may generate control signals for the semiconductor memory device 200 in order to perform a write operation, a read operation, a normal refresh operation, and a hammer refresh operation. The control logic circuit 210 includes a command decoder 211 that decodes the command CMD received from the memory controller 30 and a mode register set (MRS) 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, the second control signal CTL2 to control the ECC engine 350, the third control signal CTL3 to control the refresh control circuit 400 and a fourth control signal CTL4 to control the row hammer management circuit 500.

Figure 4:
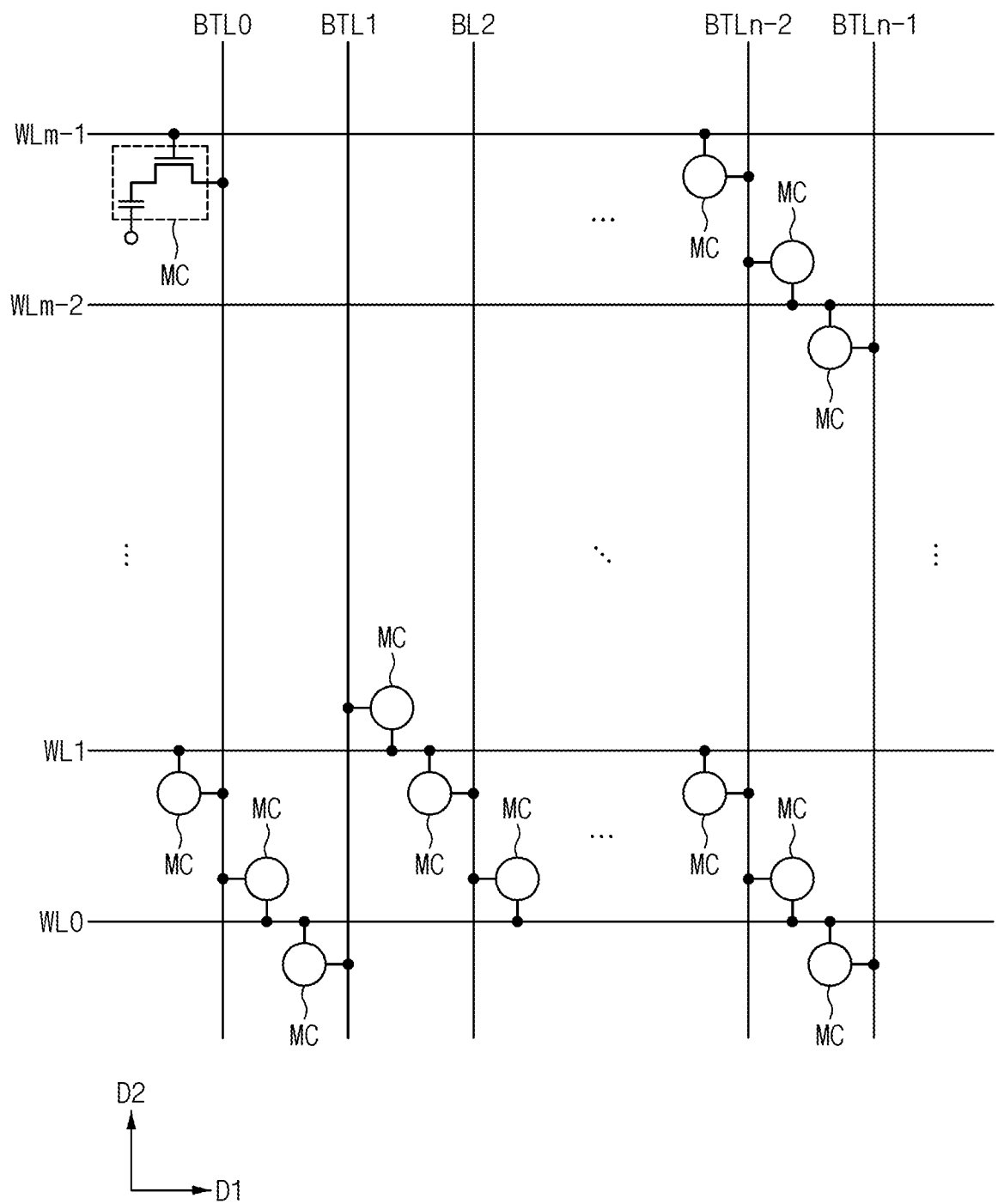
FIG. 4 illustrates an example of the first bank array in the semiconductor memory device of FIG. 3.

FIG. 4 illustrates an example of the first bank array in the semiconductor memory device of FIG. 3 according to example embodiments. Referring to FIG. 4, the first bank array 310a includes a plurality of word-lines WL0~WLm-1 (m is a natural number greater than two), a plurality of bit-lines BL0~BLn-1 (n is a natural number greater than two), and a plurality of memory cells MCs disposed at intersections between the word-lines WL0~WLm-1 and the bit-lines BL0~BLn-1. Each of the memory cells MCs includes a cell transistor coupled to each of the word-lines WL0~WLm-1 and each of the bit-lines BL0~BLn-1 and a cell capacitor coupled to the cell transistor. Each of the memory cells MCs may have a DRAM cell structure. Each of the word-lines WL0~WLm-1 extends in a first direction D1 and each of the bit-lines BL1~BLn-1 extends in a second direction D2 crossing the first direction D1. The word-lines WL0~WLm-1 coupled to the plurality of memory cells MCs may be referred to as rows of the first bank array 310a and the bit-lines BL0~BLn-1 coupled to the plurality of memory cells MCs may be referred to as columns of the first bank array 310a.

Figure 5:
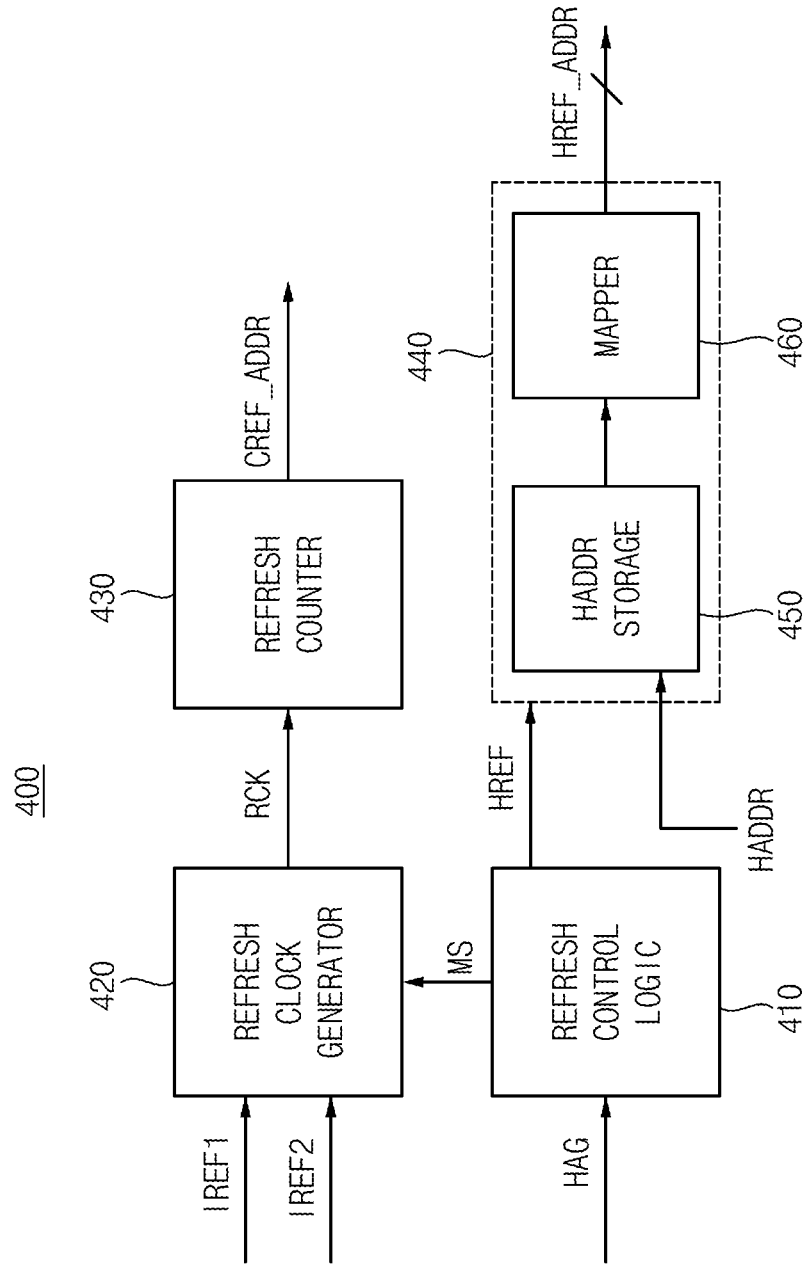
FIG. 5 is a block diagram illustrating an example of the refresh control circuit in FIG. 3 according to example embodiments.

FIG. 5 is a block diagram illustrating an example of the refresh control circuit in FIG. 3, according to example embodiments. Referring to FIG. 5, the refresh control circuit 400 may include a refresh control logic 410, a refresh clock generator 420, a refresh counter 430 and a hammer refresh address generator 440. This refresh control logic 410 may provide a mode signal MS based on the hammer address generation signal HAF. In addition, the refresh control logic 410 may provide the hammer refresh address generator 440 with a hammer refresh signal HREF to control output timing of the hammer address in response to one of a first refresh signal IREF1 and a second refresh control signal IREF2.

The refresh clock generator 420 may generate a refresh clock signal RCK indicating a timing of a normal refresh operation based on the first refresh signal IREF1, the second refresh signal IREF2 and the mode signal MS. The refresh clock generator 420 may generate the refresh clock signal RCK in response to the receiving the first refresh signal IREF1 or during the second refresh signal IREF2 is activated.

When the command CMD from the memory controller 30 corresponds to an auto refresh command, the control logic circuit 210 in FIG. 3 may apply the first refresh signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh signal IREF2 to the refresh control circuit 400 and the second refresh signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows by performing counting operation at the period of the refresh clock signal RCK, and may provide the counter refresh address CREF_ADDR as the refresh row address REF_ADDR to the row address multiplexer 240 in FIG. 3.

The hammer refresh address generator 440 may include a hammer address storage 450 and a mapper 460. For example, the hammer address storage 450 may store the hammer address HADDR and may output the hammer address HADDR to the mapper 450 in response to the hammer refresh signal HREF. The mapper 460 may generate hammer refresh addresses HREF_ADDR designating one or more victim memory cell rows physically adjacent to a memory cell row corresponding to the hammer address HADDR. The hammer refresh address generator 440 may provide the hammer refresh address HREF_ADDR as the refresh row address REF_ADDR to the row address multiplexer 240 in FIG. 3.

Figure 6:
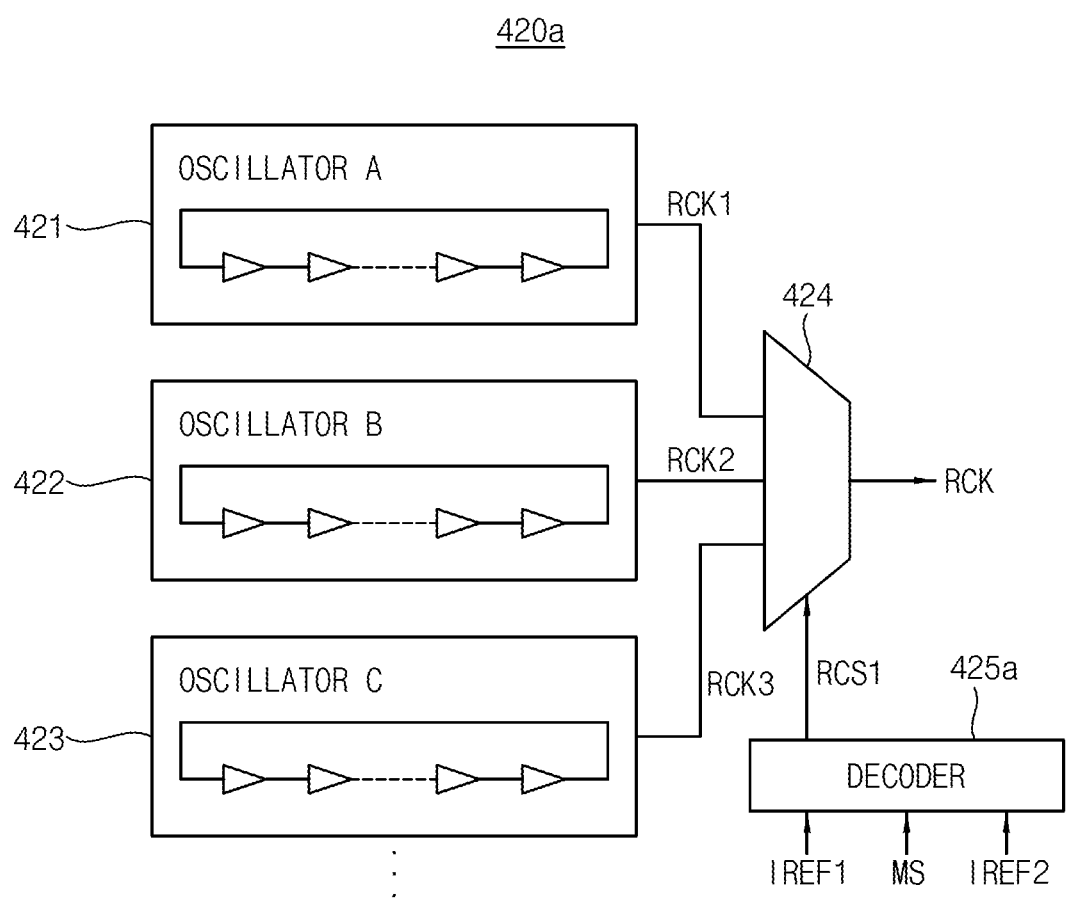
FIG. 6 is a circuit diagram illustrating an example of the refresh clock generator shown in FIG. 5 according to example embodiments.

FIG. 6 is a circuit diagram illustrating an example of the refresh clock generator shown in FIG. 5 according to example embodiments. Referring to FIG. 6, a refresh clock generator 420a may include a plurality of oscillators 421, 422 and 423, a multiplexer 424 and a decoder 425a. The decoder 425a may decode a first refresh signal IREF1, a second refresh signal IREF2 and the mode signal MS to output a clock control signal RCS1. The oscillators 421, 422, and 423 generate refresh clock signals RCK1, RCK2 and RCK3 having different periods. The multiplexer 424 selects one of the refresh clock signals RCK1, RCK2 and RCK3 to provide the refresh clock signal RCK in response to the clock control signal RCS1. Because the mode signal MS indicates that the hammer address is generated, the refresh clock generator 420a may adjust a refresh cycle by selecting one of the refresh clock signals RCK1, RCK2 and RCK3. The first refresh signal IREF1 and the second refresh signal IREF2 may be included in the third control circuit CTL3 in FIG. 3.

Figure 7:
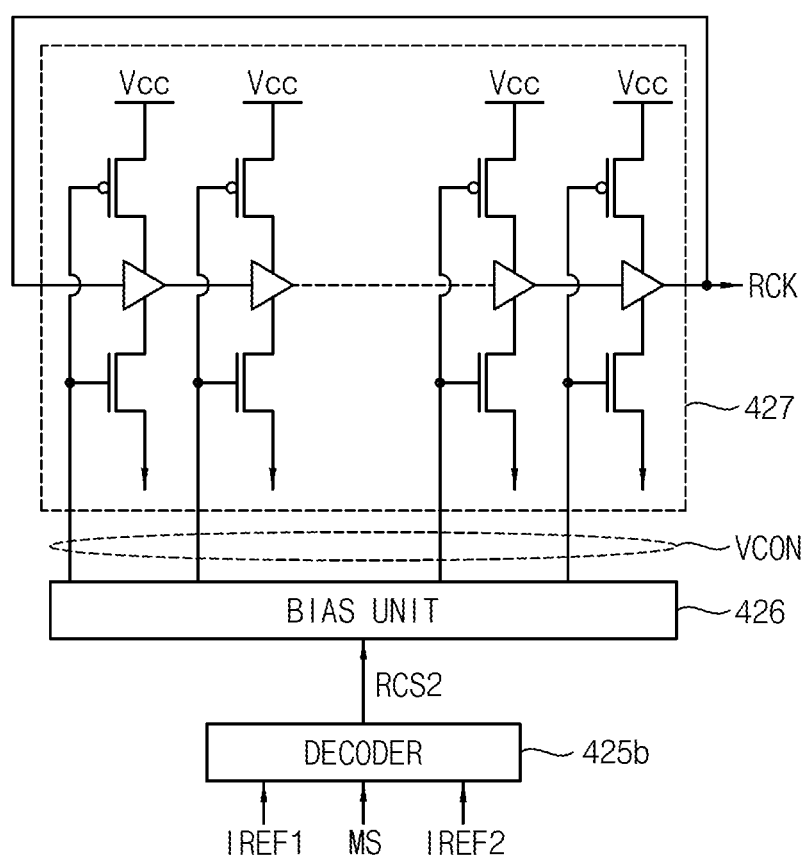
FIG. 7 is a circuit diagram illustrating another example of the refresh clock generator in FIG. 5 according to example embodiments.

FIG. 7 is a circuit diagram illustrating another example of the refresh clock generator in FIG. 5 according to example embodiments. Referring to FIG. 7, a refresh clock generator 420b may include a decoder 425b, a bias unit 426 and an oscillator 427. The oscillator 427 may include a plurality of delay cells connected in series. Each of the plurality of delay cells may be connected between a power supply voltage Vcc and a ground voltage and each of the plurality of delay cells may include a p-channel metal-oxide semiconductor (PMOS) transistor, a buffer and an n-channel metal-oxide semiconductor (NMOS) transistor connected in series between the power supply voltage Vcc and the ground voltage.

The decoder 425b may decode the first refresh signal IREF1, the second refresh signal IREF2 and the mode signal MS to output a clock control signal RCS2. The bias unit 426 generates a control voltage VCON in response to the clock control signal RCS2. The oscillator 427 generates the refresh clock signal RCK having a variable period, according to the control voltage VCON applied to gates of the PMOS transistors and the NMOS transistors. Because the mode signal MS indicates that the hammer address is generated, the refresh clock generator 420b may adjust a refresh cycle by varying a period of the refresh clock signal RCK based on the clock control signal RCS2.

Figure 8:
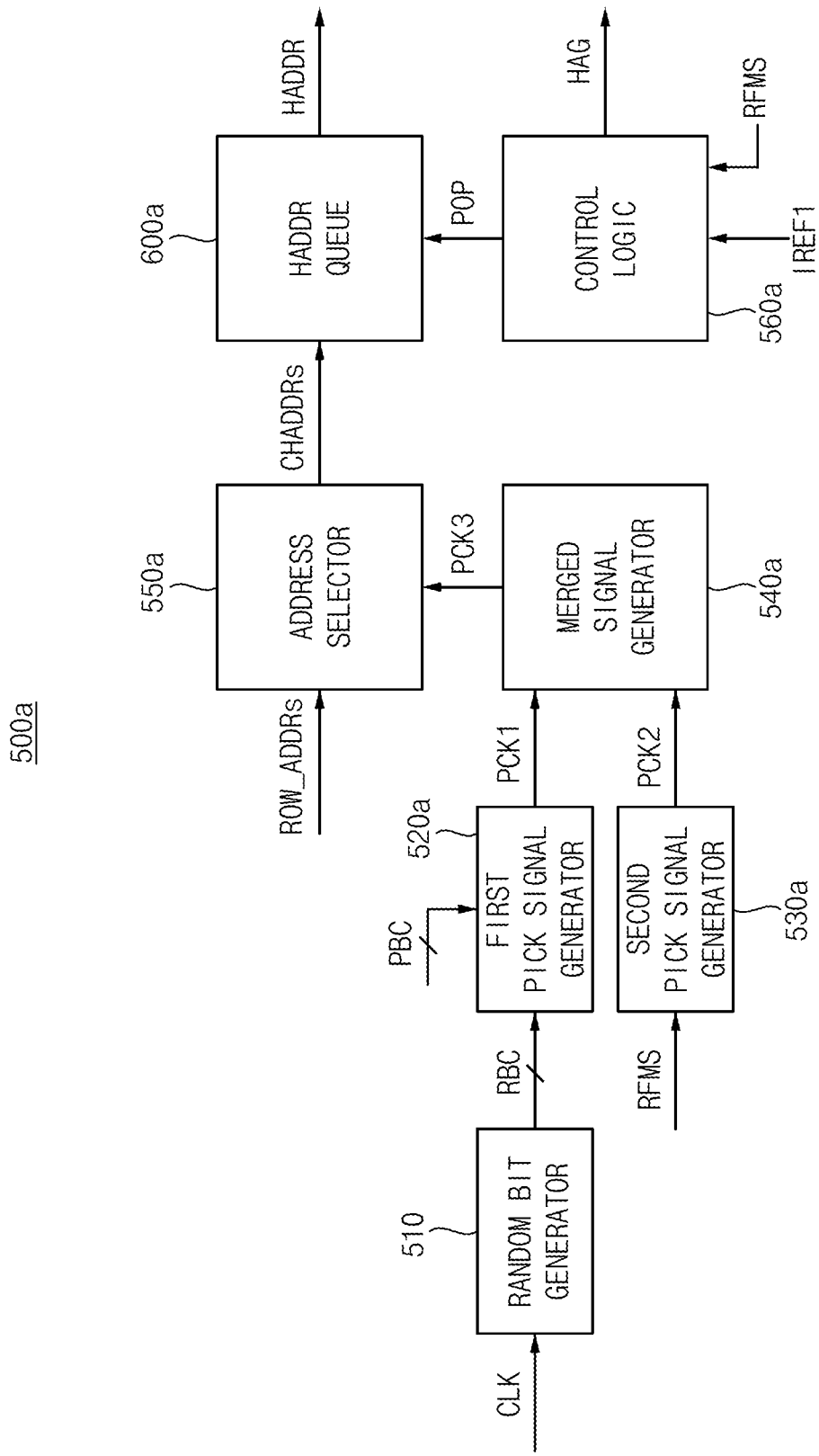
FIG. 8 is a block diagram illustrating an example of the row hammer management circuit in the semiconductor memory device of FIG. 3 according to example embodiments.

FIG. 8 is a block diagram illustrating an example of the row hammer management circuit in the semiconductor memory device of FIG. 3 according to example embodiments. Referring to FIG. 8, a row hammer management circuit 500a may include a random bit generator 510, a first pick signal generator 520a, a second pick signal generator 530a, a merged signal generator 540a, an address selector 550a, a control logic 560a and a hammer address (HADDR) queue 600a. The random bit generator 510 may generate a random binary code RBC varying randomly, in response to the clock signal CLK and may provide the random binary code RBC to the first pick signal generator 520a. The random bit generator 510 may generate the random binary code RBC based on a linear feedback shift register (LFSR) or a pseudo-random binary sequence (PRBS).

The first pick signal generator 520a may generate a first pick signal PCK1 based on comparing a first set of the random binary code RBC and a second set of a reference binary code PBC. The first pick signal generator 520a may output the first pick signal PCK1 with a first logic level in response to the first set of the random binary code RBC matching the second set of the reference binary code PBC and may output the first pick signal PCK1 with a second logic level in response to the first set of the random binary code RBC not matching (being different from) the second set of the reference binary code PBC. The first set of the random binary code RBC may include all bits or lower k bits of the random binary code RBC and the second set of the reference binary code PBC may include all bits or lower k bits of the reference binary code PBC. Here, k is a natural number greater than one.

The second pick signal generator 530a may generate a second pick signal PCK based on a refresh management signal RFM that is generated based on the refresh management command. The second pick signal generator 530a may output the second pick signal PCK with a first logic level in response to the refresh management signal RFMS being activated to indicate that the refresh management command is received and may output the second pick signal PCK with a second logic level in response to the refresh management signal RFMS being deactivated to indicate that the refresh management command is not received. When the refresh management command is received, the refresh management signal RFMS may be a pulse signal that has a predetermined activation interval.

The merged signal generator 540a may generate a third pick signal PCK3 by performing an OR operation on the first pick signal PCK1 and the second pick signal PCK2. Therefore, the merged signal generator 540a may output the third pick signal PCK3 with a first logic level when at least one of the PCK1 and the second pick signal PCK2 has a first logic level and may output the third pick signal PCK3 with a second logic level when both of the PCK1 and the second pick signal PCK2 have a second logic level.

The address selector 550a may sequentially receive row addresses ROW_ADDRs, may select (or, capture) a portion of the row addresses ROW_ADDRs based on the third pick signal PCK3 and may store the selected row addresses in the hammer address queue 600a as candidate hammer addresses CHADDRs. The address selector 550a may capture a row address that is received at a timing when the third pick signal PCK3 has a first logic level. Therefore, the address selector 550a may select a first row address at a timing when the third pick signal PCK3 has a first logic level from among first access row addresses received during a reference time interval, may store the first row address in the hammer address queue 600 as a first candidate hammer address, may select a second row address received right after receiving the refresh management command after the reference time interval, and may store the second row address in the hammer address queue 600 as a second candidate hammer address. In some embodiments, a probability of the first row address being randomly captured may correspond to $1/2^k$ if the first row address from first access row addresses is received at a timing when the third pick signal PCK3 has a first logic level, in response to all bits or lower k bits of the random binary code RBC.

The control logic 560a may apply a pop signal POP to the hammer address queue 600a based on the first refresh signal IREF1 indicating first refresh timings based on refresh commands from the memory controller 30 and the refresh management signal RFMS, and may provide the hammer address generation signal HAG to the refresh control circuit 400 in FIG. 3. The hammer address queue 600a may sequentially provide (or, output) the candidate hammer addresses CHADDRs stored therein as the hammer address HADDR to the refresh control circuit 400 in FIG. 3 in response to the pop signal POP.

Therefore, the row hammer management circuit 500a may select one of the first access row addresses as the first row address in response to the first set of the random binary code RBC matching the second set of the reference binary code PBC and may select a row address received from the memory controller 30 right after receiving the refresh management command as the second row address.

Figure 9:
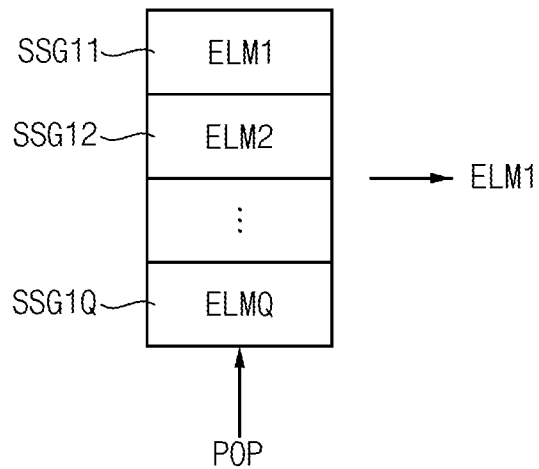
FIG. 9 illustrates an example of the hammer address queue in FIG. 8 according to example embodiments.

FIG. 9 illustrates an example of the hammer address queue in FIG. 8 according to example embodiments. Referring to FIG. 9, the hammer address queue 600a in FIG. 8 may include a first-in and first-out register 600aa. As shown, this first-in and first-out register 600aa may include a plurality of storage segments SSG11, SSG12, . . . , SSG1Q and the plurality of storage segments SSG11, SSG12, . . . , SSG1Q may store elements ELM1, ELM2, . . . , ELMQ based on first-in and first-out scheme and may output the element ELM1 which is input first of all in response to the pop signal POP. Here, Q is a natural number greater than two.

Figure 10:
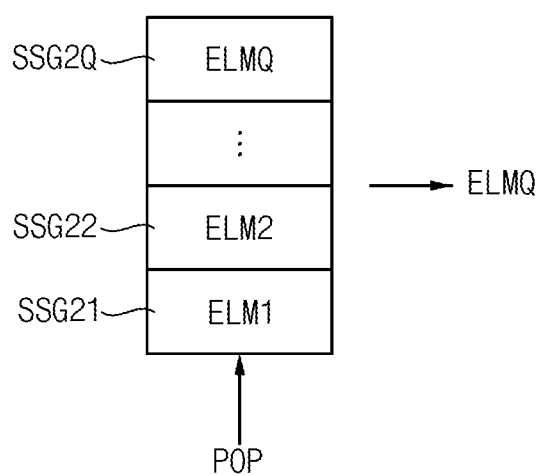
FIG. 10 illustrates an example of the hammer address queue in FIG. 8 according to example embodiments.

FIG. 10 illustrates an example of the hammer address queue in FIG. 8 according to example embodiments. Referring to FIG. 10, the hammer address queue 600*a* in FIG. 8 may include a last-in and first-out stack 600*ab*. As shown, the last-in and first-out stack 600*ab* may include a plurality of storage segments SSG21, SSG22, . . . , SSG2Q and the plurality of storage segments SSG21, SSG22, . . . , SSG2Q may store elements ELM1, ELM2, . . . , ELMQ based on last-in and first-out scheme and may output the element ELMQ which is input last of all in response to the pop signal POP. Here, Q is a natural number greater than two.

Figure 11A:
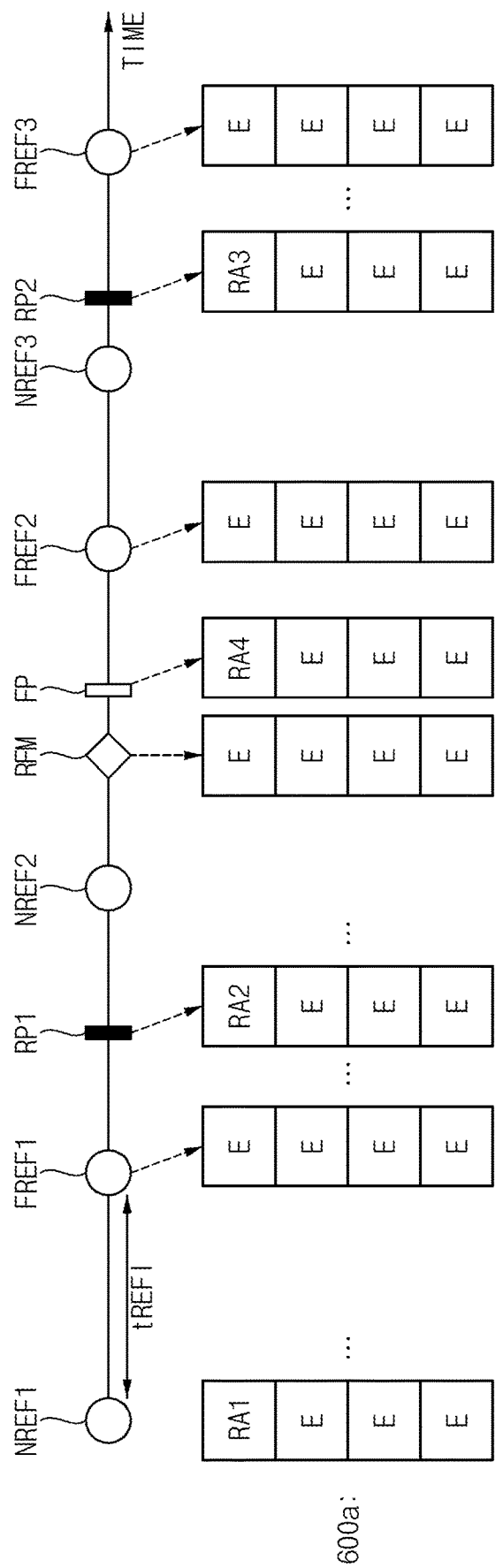
FIGS. 11A and 11B illustrate operations of the row hammer management circuit of FIG. 8 according to example embodiments.
Figure 11B:
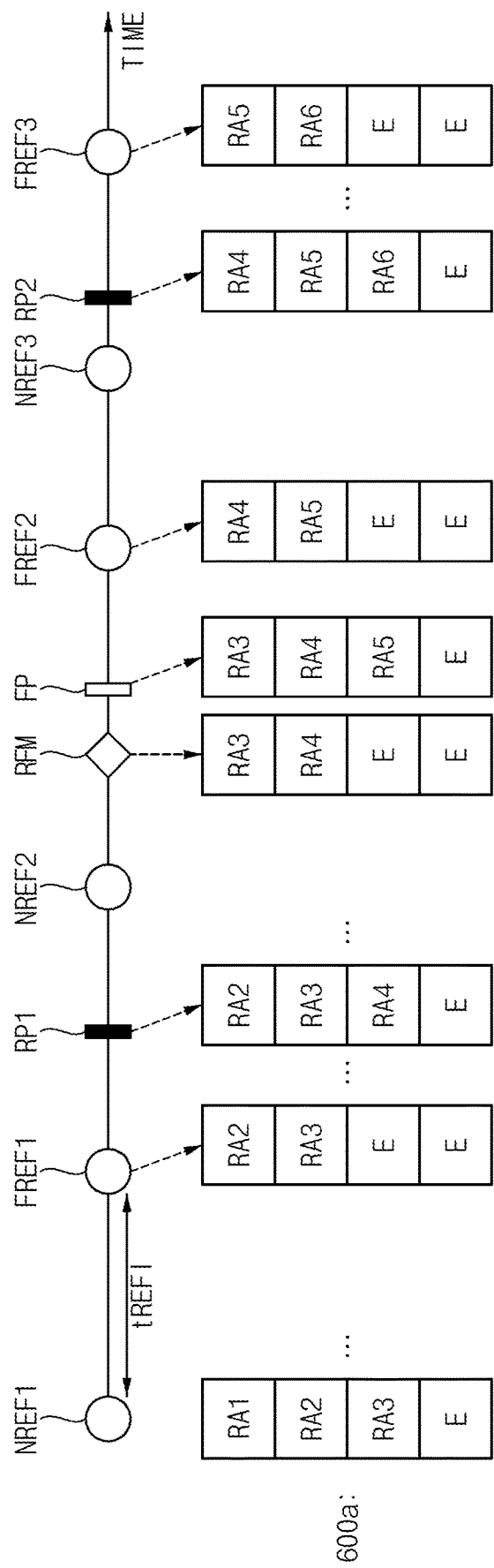
Figure 12:
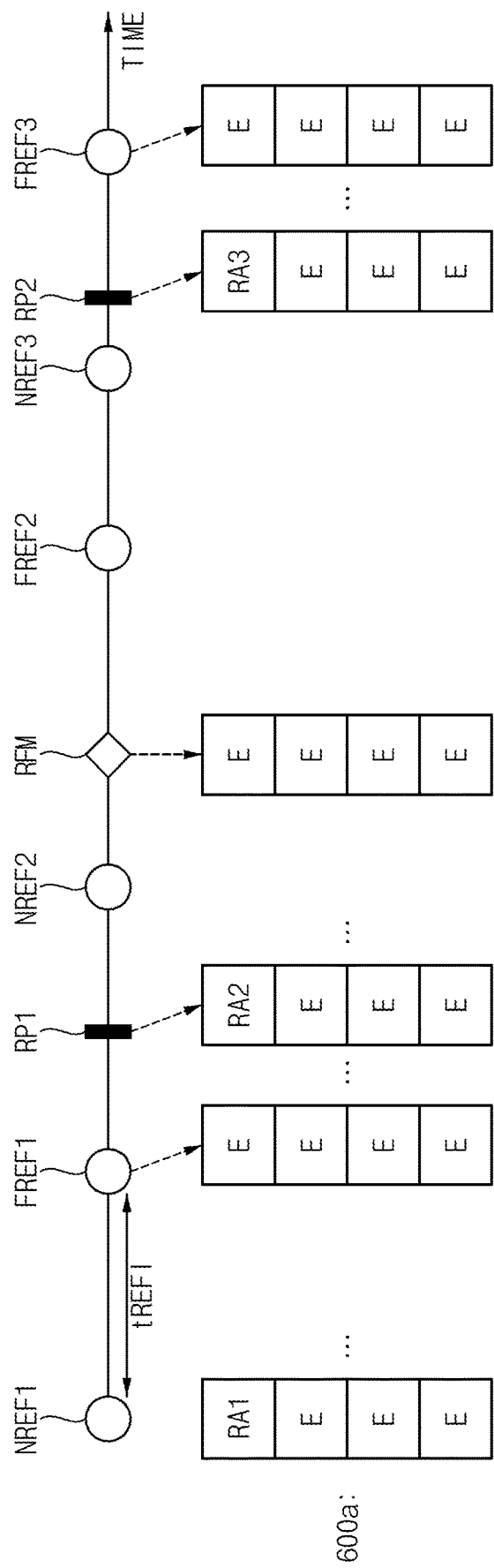
FIG. 12 illustrates an operation of the row hammer management circuit of FIG. 8 when a forced pick operation is not performed.

FIGS. 11A and 11B illustrate operations of the row hammer management circuit of FIG. 8 according to example embodiments, respectively, and FIG. 12 illustrates an operation of the row hammer management circuit of FIG. 8 when a forced pick operation is not performed. In FIGS. 11A, 11B and 12, normal refresh operations NREF1, NREF2 and NREF3 and hammer refresh operations FREF1, FREF2 and FREF3 are illustrated, each of an interval between the normal refresh operations NREF1, NREF2 and NREF3 and an interval between the hammer refresh operations FREF1, FREF2 and FREF3 corresponds to a refresh interval tREFI of the semiconductor memory device 200 and the refresh interval tREFI may correspond to the reference time interval. In addition, in FIGS. 11A, 11B and 12, E represents that a corresponding storage element of the hammer address queue 600*a* is empty.

Referring to FIG. 11A, a row address RA1 has been stored in the hammer address queue 600*a* as a candidate hammer address before the normal refresh operation NREF1 is performed, and when the row address RA1 is output as the hammer address, the hammer refresh operation FREF1 is performed on one or more victim memory cell rows, which are physically adjacent to a memory cell row designated by the row address RA1.

During a reference time interval between a timing of the hammer refresh operation FREF1 and a timing of the normal refresh operation NREF2, the row hammer management circuit 500*a* captures a row address RA2 by a random pick operation RP1 from among first access row addresses to store the row address RA2 in the hammer address queue 600*a* as a candidate hammer address, a refresh management RFM command is received from the memory controller 30 after the normal refresh operation NREF2 is performed and the hammer refresh operation FREF2 is performed on one or more victim memory cell rows, which are physically adjacent (e.g., immediately adjacent) to a memory cell row designated by the row address RA2, in response to receiving the refresh management RFM command.

The row hammer management circuit 500*a* stores a row address RA4, which is received subsequent to (e.g., right after) receiving the refresh management RFM command in the hammer address queue 600*a* as a candidate hammer address by performing a forced pick FP operation on the row address RA4. When the row address RA4 is output as the hammer address, the hammer refresh operation FREF2 is performed on one or more victim memory cell rows which are physically adjacent to a memory cell row designated by the row address RA4.

During a reference time interval between a timing of the hammer refresh operation FREF2 and a timing of the normal refresh operation NREF3, the row hammer management circuit 500*a* captures a row address RA3 by performing a random pick operation RP2 from among first access row addresses, to thereby store the row address RA3 in the hammer address queue 600*a* as a candidate hammer address. When the row address RA3 is output as the hammer address, the hammer refresh operation FREF3 is performed on one or more victim memory cell rows, which are physically adjacent to a memory cell row designated by the row address RA3.

In FIG. 11B, descriptions repeated with FIG. 11A will be omitted. Referring to FIG. 11B, row addresses RA1, RA2 and RA3 have been stored in the hammer address queue 600*a* as candidate hammer addresses before the normal refresh operation NREF1 is performed, and when the row address RA1 is output as the hammer address according to the first-in and first-out scheme, the hammer refresh operation FREF1 is performed on one or more victim memory cell rows which are physically adjacent to a memory cell row designated by the row address RA1.

During a reference time interval between a timing of the hammer refresh operation FREF1 and a timing of the normal refresh operation NREF2, the row hammer management circuit 500*a* captures a row address RA4 by a random pick operation RP1 from among first access row addresses to store the row address RA4 in the hammer address queue 600*a* as a candidate hammer address, a refresh management RFM command is received from the memory controller 30 after the normal refresh operation NREF2 is performed and the hammer refresh operation FREF2 is performed on one or more victim memory cell rows which are physically adjacent to a memory cell row designated by the row address RA2, in response to receiving the refresh management RFM command.

The row hammer management circuit 500*a* stores a row address RA5, which is received right after receiving the refresh management RFM command in the hammer address queue 600*a* as a candidate hammer address by performing a forced pick FP operation on the row address RA5. When the row address RA5 is output as the hammer address, the hammer refresh operation FREF2 is performed on one or more victim memory cell rows which are physically adjacent to a memory cell row designated by the row address RA5.

During a reference time interval between a timing of the hammer refresh operation FREF2 and a timing of the normal refresh operation NREF3, the row hammer management circuit 500*a* captures a row address RA6 by performing a random pick operation RP2 from among first access row addresses, to thereby store the row address RA6 in the hammer address queue 600*a* as a candidate hammer address. When the row address RA6 is output as the hammer address, the hammer refresh operation FREF3 is performed on one or more victim memory cell rows which are physically adjacent to a memory cell row designated by the row address RA6.

In FIG. 12, descriptions repeated with FIG. 11A will be omitted. Referring to FIG. 12, a refresh management RFM command is received from the memory controller 30 after the normal refresh operation NREF2 is performed, the hammer refresh operation FREF2 is performed on one or more victim memory cell rows which are physically adjacent to a memory cell row designated by the row address RA2, in response to receiving the refresh management RFM command and all storage elements of the hammer address queue 600*a* are empty. When the row hammer management circuit 500*a* does not perform a forced pick FP operation after receiving the refresh management RFM command, the hammer refresh operation FREF2 is not performed, because there is no target memory cell row on which the hammer refresh operation is to be performed. Therefore, a memory system employing a refresh management command may not enhance strength of defending row hammer attacks.

Figure 13:
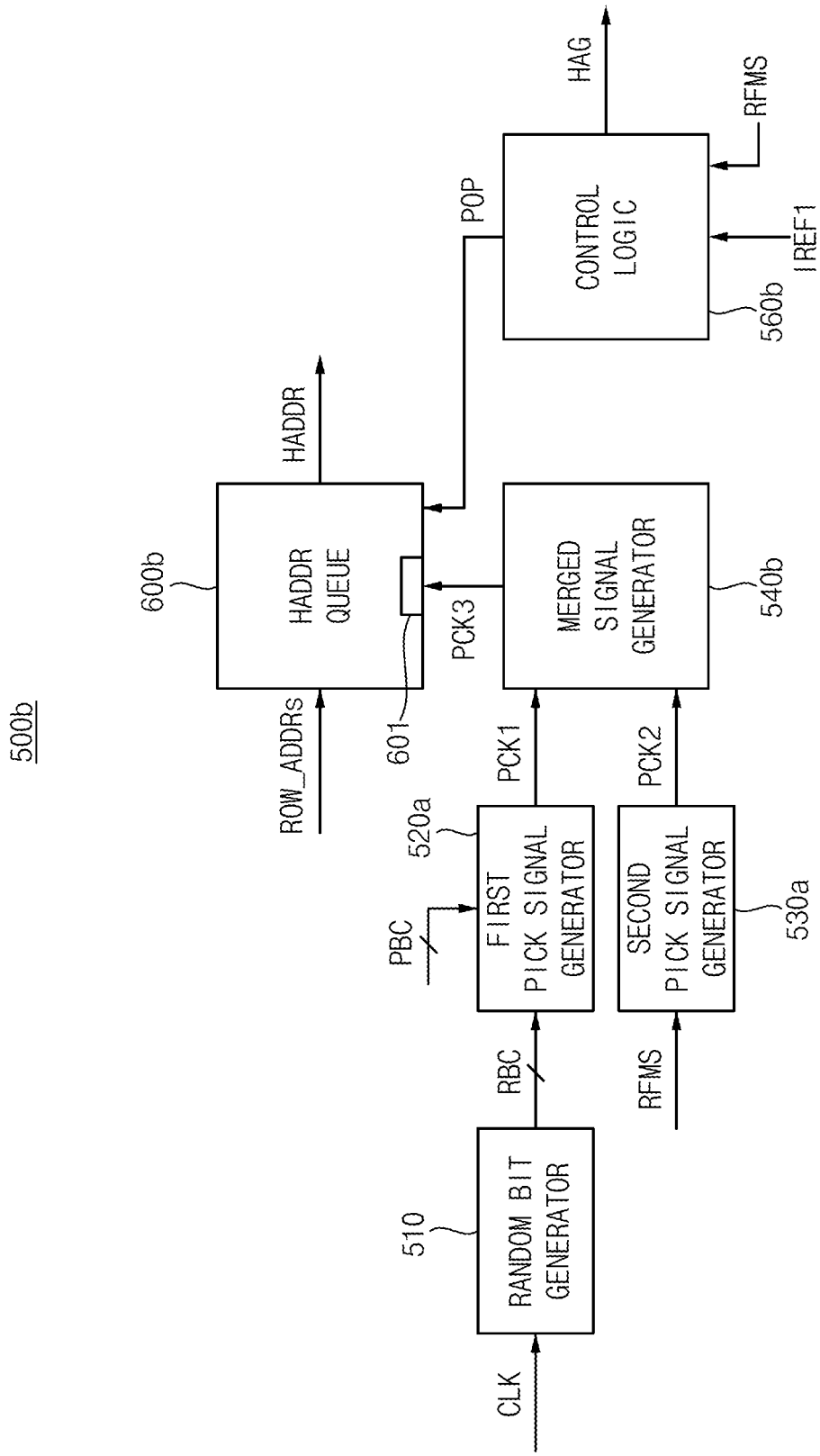
FIG. 13 is a block diagram illustrating an example of the row hammer management circuit in the semiconductor memory device of FIG. 3 according to example embodiments.

FIG. 13 is a block diagram illustrating an example of the row hammer management circuit in the semiconductor memory device of FIG. 3 according to example embodiments. Referring to FIG. 13, a row hammer management circuit 500b may include a random bit generator 510, a first pick signal generator 520a, a second pick signal generator 530a, a merged signal generator 540b, a control logic 560b and a hammer address (HADDR) queue 600b. In FIG. 13, descriptions repeated with FIG. 8 will be omitted. In addition, operation of each of the random bit generator 510, the first pick signal generator 520a and the second pick signal generator 530a is substantially the same as operation of corresponding one in FIG. 8.

The merged signal generator 540b may generate a third pick signal PCK3 by performing an OR operation on the first pick signal PCK1 and the second pick signal PCK2. Therefore, the merged signal generator 540a may output the third pick signal PCK3 with a first logic level when at least one of the PCK1 and the second pick signal PCK2 has a first logic level and may output the third pick signal PCK3 with a second logic level when both of the PCK1 and the second pick signal PCK2 have a second logic level. The merged signal generator 540b may apply the third pick signal PCK3 to a push terminal 601 of the hammer address queue 600b.

The hammer address queue 600b may sequentially receive row addresses ROW_ADDRs, and may store a portion of the row addresses ROW_ADDRs, which are received at timings when the third pick signal PCK3 has a first logic level, therein as candidate hammer addresses. Therefore, the hammer address queue 600b may store a first row address therein as first candidate hammer address at a timing when the third pick signal PCK3 has a first logic level from among first access row addresses received during a reference time interval and may store a second row address therein as a second candidate hammer address, which is received after (e.g., immediately after) receiving the refresh management command after the reference time interval.

The control logic 560b may apply a pop signal POP to the hammer address queue 600b based on the first refresh signal IREF1 indicating first refresh timings based on refresh commands from the memory controller 30 and the refresh management signal RFMS. and may provide the hammer address generation signal HAG to the refresh control circuit 400 in FIG. 3. The hammer address queue 600b may sequentially provide (or, output) the candidate hammer addresses stored therein as the hammer address HADDR to the refresh control circuit 400 in FIG. 3 in response to the pop signal POP.

Figure 14:
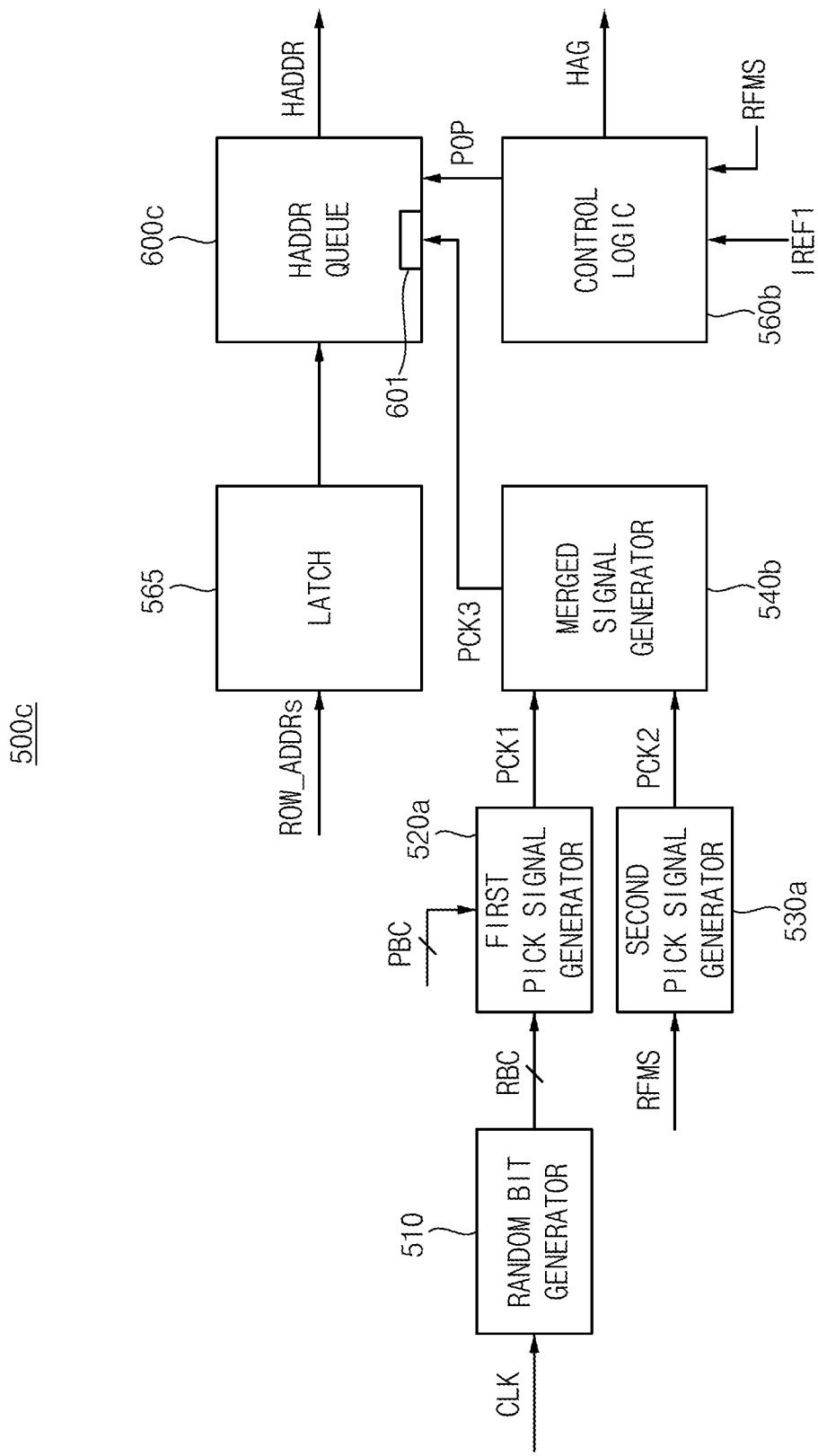
FIG. 14 is a block diagram illustrating an example of the row hammer management circuit in the semiconductor memory device of FIG. 3 according to example embodiments.

FIG. 14 is a block diagram illustrating an example of the row hammer management circuit in the semiconductor memory device of FIG. 3 according to example embodiments. Referring to FIG. 14, a row hammer management circuit 500c may include a random bit generator 510, a first pick signal generator 520a, a second pick signal generator 530a, a merged signal generator 540b, a latch 565, a control logic 560b and a hammer address (HADDR) queue 600c. In FIG. 14, descriptions repeated with FIG. 8 will be omitted. Operation of each of the random bit generator 510, the first pick signal generator 520a and the second pick signal generator 530a is substantially the same as operation of corresponding one in FIG. 8.

The merged signal generator 540b may generate a third pick signal PCK3 by performing an OR operation on the first pick signal PCK1 and the second pick signal PCK2. Therefore, the merged signal generator 540a may output the third pick signal PCK3 with a first logic level when at least one of the PCK1 and the second pick signal PCK2 has a first logic level and may output the third pick signal PCK3 with a second logic level when both of the PCK1 and the second pick signal PCK2 have a second logic level. The merged signal generator 540b may apply the third pick signal PCK3 to a push terminal 601 of the hammer address queue 600c.

The latch 565 may sequentially receive row addresses ROW_ADDRs to store the row addresses ROW_ADDRs and may provide the stored row addresses ROW_ADDRs to the hammer address queue 600c sequentially. The hammer address queue 600c may sequentially receive the row addresses ROW_ADDRs provided from the latch 565, and may store a portion of the row addresses ROW_ADDRs, which are received at timings when the third pick signal PCK3 has a first logic level, as candidate hammer addresses CHADDRs. Therefore, the hammer address queue 600c may store a first row address therein as first candidate hammer address at a timing when the third pick signal PCK3 has a first logic level from among first access row addresses received during a reference time interval and may store a second row address therein as a first candidate hammer address, which is received before receiving the refresh management command after the reference time interval.

The control logic 560b may apply a pop signal POP to the hammer address queue 600b based on the first refresh signal IREF1 indicating first refresh timings based on refresh commands from the memory controller 30 and the refresh management signal RFMS. and may provide the hammer address generation signal HAG to the refresh control circuit 400 in FIG. 3. The hammer address queue 600c may sequentially provide (or, output) the candidate hammer addresses stored therein as the hammer address HADDR to the refresh control circuit 400 in FIG. 3 in response to the pop signal POP.

Figure 15:
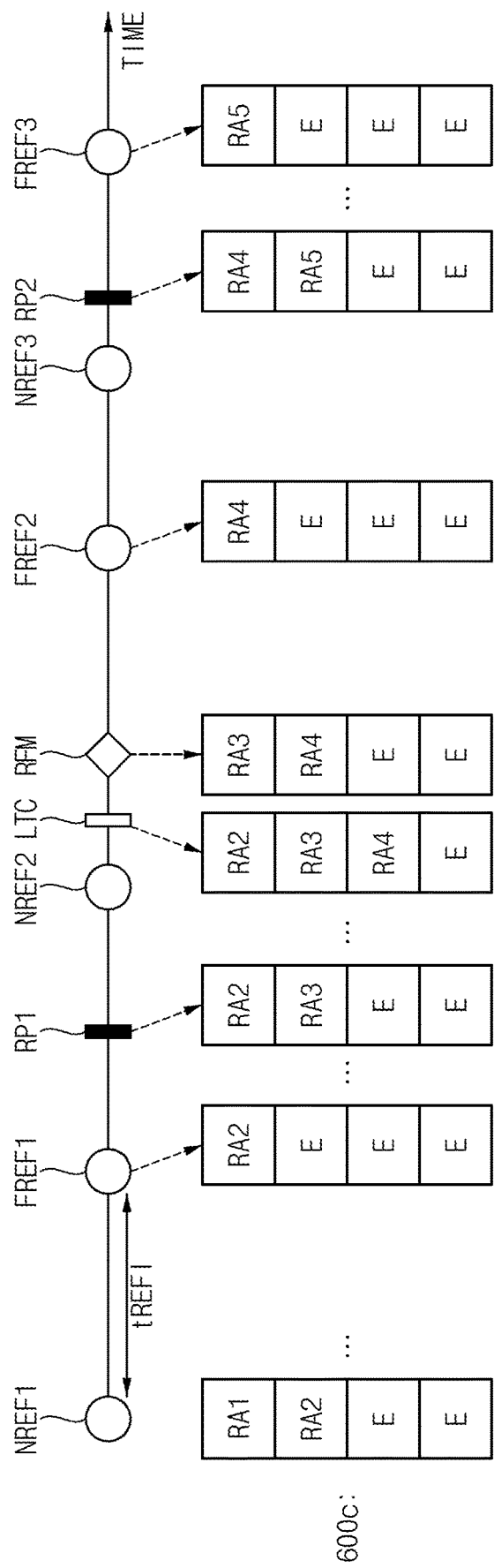
FIG. 15 illustrates an operation of the row hammer management circuit of FIG. 14 according to example embodiments.

FIG. 15 illustrates an operation of the row hammer management circuit of FIG. 14 according to example embodiments. In FIG. 15, normal refresh operations NREF1, NREF2 and NREF3 and hammer refresh operations FREF1, FREF2 and FREF3 are illustrated; each of an interval between the normal refresh operations NREF1, NREF2 and NREF3 and an interval between the hammer refresh operations FREF1, FREF2 and FREF3 corresponds to a refresh interval tREFI of the semiconductor memory device 200 and the refresh interval tREFI may correspond to the reference time interval. In addition, in FIG. 15, the designation "E" represents that a corresponding storage element of the hammer address queue 600c is empty.

Referring to FIG. 15, row addresses RA1 and RA2 have been stored in the hammer address queue 600c as candidate hammer addresses before the normal refresh operation NREF1 is performed, and when the row address RA1 is output as the hammer address according to the first-in and first-out scheme, the hammer refresh operation FREF1 is performed on one or more victim memory cell rows which are physically adjacent to a memory cell row designated by the row address RA1.

During a reference time interval, between a timing of the hammer refresh operation FREF1 and a timing of the normal refresh operation NREF2, the row hammer management circuit 500c captures a row address RA4 by a random pick operation RP1 from among first access row addresses to store the row address RA4 in the hammer address queue 600c as a candidate hammer address, a row address RA4 is latched LTC in the latch 565 after the normal refresh operation NREF2 is performed, a refresh management RFM command is received from the memory controller 30 after the latching operation, the row address RA2 is output as the hammer address and the hammer refresh operation FREF2 is performed on one or more victim memory cell rows, which are physically adjacent to a memory cell row designated by the row address RA2, in response to receiving the refresh management RFM command.

When the row address RA3 is output as the hammer address, the hammer refresh operation FREF2 is performed on one or more victim memory cell rows which are physically adjacent to a memory cell row designated by the row address RA3. During a reference time interval between a timing of the normal refresh operation NREF3 and a timing of the hammer refresh operation FREF3, the row hammer management circuit 500c captures a row address RA5 by a random pick operation RP2 from among first access row addresses to store the row address RA5 in the hammer address queue 600c as a candidate hammer address. When the row address RA5 is output as the hammer address, the hammer refresh operation FREF3 is performed on one or more victim memory cell rows which are physically adjacent to a memory cell row designated by the row address RA5.

Figure 16:
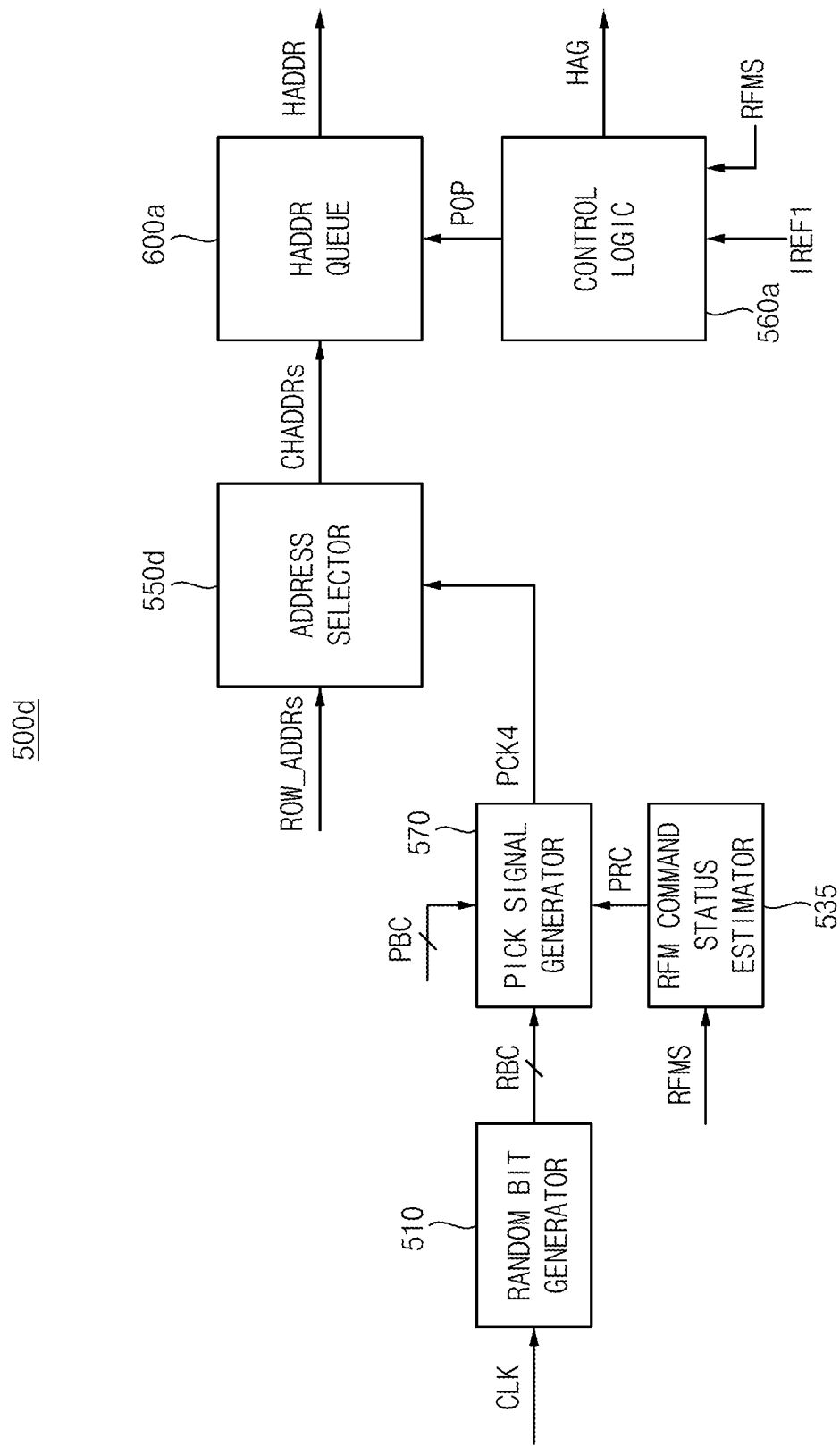
FIG. 16 is a block diagram illustrating an example of the row hammer management circuit in the semiconductor memory device of FIG. 3 according to example embodiments.

FIG. 16 is a block diagram illustrating an example of the row hammer management circuit in the semiconductor memory device of FIG. 3 according to example embodiments. Referring to FIG. 16, a row hammer management circuit 500d may include a random bit generator 510, a RFM command status estimator 535, a pick signal generator 570, an address selector 550, a control logic 560a and a hammer address queue 600a. The random bit generator 510 may generate a random binary code RBC varying randomly, in response to the clock signal CLK and may provide the random binary code RBC to the pick signal generator 570.

The pick signal generator 570 may generate a pick signal PCK4 in response to comparing a first set of the random binary code RBC and a second set of a reference binary code PBC. Then, the pick signal generator 570 may output the pick signal PCK4 with a first logic level in response to the first set of the random binary code RBC matching the second set of the reference binary code PBC, or may output the pick signal PCK4 with a second logic level (different from the first logic level) in response to the first set of the random binary code RBC not matching (i.e., being different from) the second set of the reference binary code PBC. The first set of the random binary code RBC may include all bits or lower k bits of the random binary code RBC and the second set of the reference binary code PBC may include all bits or lower k bits of the reference binary code PBC. Here, k is a natural number greater than one.

The RFM command status estimator 535 may provide the pick signal generator 570 with a pick ratio control signal PRC for adjusting the number of bits in the first set based on a refresh management signal RFMS that is generated based on the refresh management command. The RFM command status estimator 535 may generate the pick ratio control signal PRC such that: (i) the number of bits in the first set decreases in response to the refresh management signal RFMS being activated, and (ii) the number of bits in the first set increases in response to the refresh management signal RFMS being deactivated.

The address selector 550b may select (or, capture) one of the row addresses ROW_ADDRs sequentially received during a reference time interval and a second row based on the pick signal PCK4 and a second row address received, after receiving the refresh management command, and may store the selected row addresses in the hammer address queue 600a as candidate hammer addresses CHADDRs. The control logic 560a may apply a pop signal POP to the hammer address queue 600a based on the first refresh signal IREF1, indicating first refresh timings based on refresh commands from the memory controller 30 and the refresh management signal RFMS, and may provide the hammer address generation signal HAG to the refresh control circuit 400 in FIG. 3.

The control logic 560a may apply a pop signal POP to the hammer address queue 600a based on the first refresh signal IREF1 indicating first refresh timings based on refresh commands from the memory controller 30 and the refresh management command RFMS, and may provide the hammer address generation signal HAG to the refresh control circuit 400 in FIG. 3. Accordingly, the row hammer management circuit 500d may adjust the number of bits in the first set of the random binary code RBC based on a status of the refresh management command.

Figure 17:
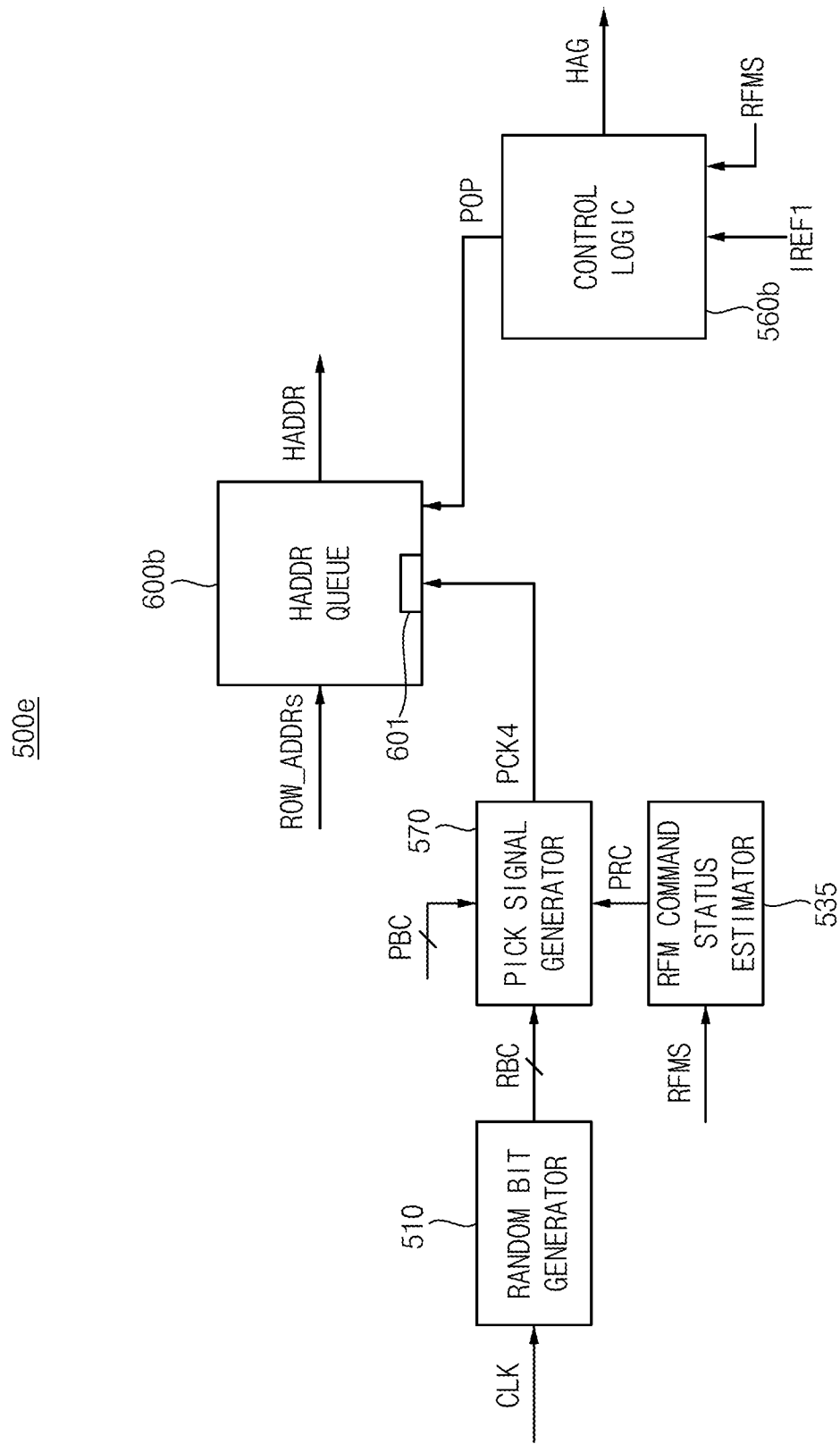
FIG. 17 is a block diagram illustrating an example of the row hammer management circuit in the semiconductor memory device of FIG. 3 according to example embodiments.

FIG. 17 is a block diagram illustrating an example of the row hammer management circuit in the semiconductor memory device of FIG. 3 according to example embodiments. Referring to FIG. 17, a row hammer management circuit 500e may include a random bit generator 510, a RFM command status estimator 535, a pick signal generator 570, control logic 560b and a hammer address queue 600b. In FIG. 17, descriptions repeated with FIG. 16 will be omitted. Therefore, each operation of the random bit generator 510, the RFM command status estimator 535 and the pick signal generator 570 is substantially the same as operation of corresponding one in FIG. 16.

The hammer address queue 600b may sequentially receive the row addresses ROW_ADDRs, and may store a portion of the row addresses ROW_ADDRs, which are received at timings when the pick signal PCK4 has a first logic level, therein as candidate hammer addresses. Therefore, the hammer address queue 600b may store a first row address therein as first candidate hammer address at a timing when the pick signal PCK4 has a first logic level from among first access row addresses received during a reference time interval, and may store a second row address therein as a second candidate hammer address, which is received before receiving the refresh management command after the reference time interval.

The control logic 560b may apply a pop signal POP to the hammer address queue 600b based on the first refresh signal IREF1 indicating first refresh timings based on refresh commands from the memory controller 30 and the refresh management signal RFMS, and may provide the hammer address generation signal HAG to the refresh control circuit 400 in FIG. 3. The hammer address queue 600b may sequentially provide (or, output) the candidate hammer addresses stored therein as the hammer address HADDR to the refresh control circuit 400 in FIG. 3 in response to the pop signal POP.

Figure 18:
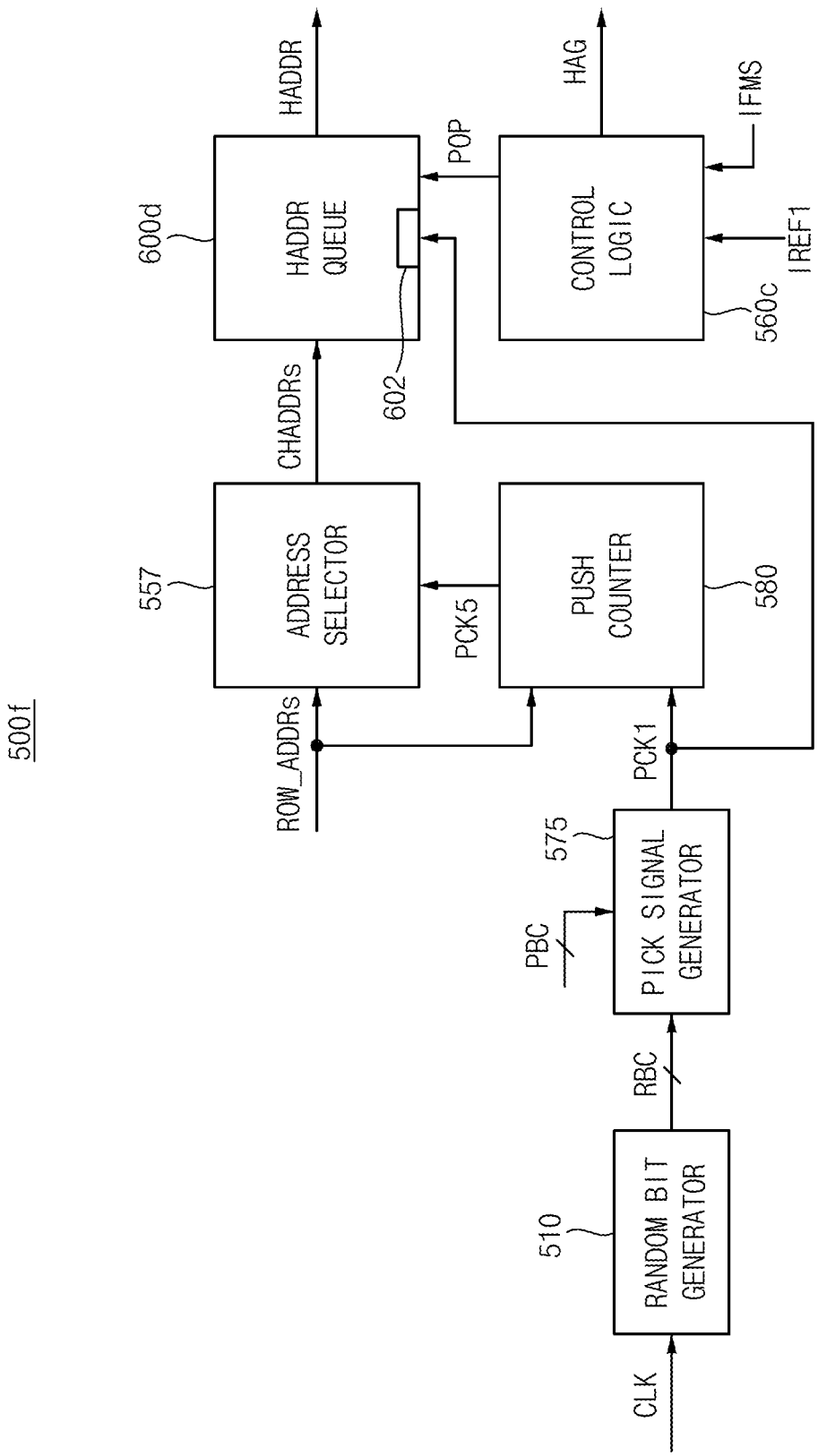
FIG. 18 is a block diagram illustrating an example of the row hammer management circuit in the semiconductor memory device of FIG. 3 according to example embodiments.

FIG. 18 is a block diagram illustrating an example of the row hammer management circuit in the semiconductor memory device of FIG. 3 according to example embodiments. Referring to FIG. 18, a row hammer management circuit 500f may include a random bit generator 510, a pick signal generator 575, an address selector 557, a push counter 580, a control logic 560c and a hammer address queue 600d.

The random bit generator 510 may generate a random binary code RBC varying randomly, in response to the clock signal CLK and may provide the random binary code RBC to the pick signal generator 575. Moreover, the pick signal generator 570 may generate a first pick signal PCK1 based on comparing a first set of the random binary code RBC and a second set of a reference binary code PBC. The pick signal generator 570 may output the first pick signal PCK1 with a first logic level in response to the first set of the random binary code RBC matching the second set of the reference binary code PBC and may output the first pick signal PCK1 with a second logic level in response to the first set of the random binary code RBC not matching (i.e., being different from) the second set of the reference binary code PBC. The first set of the random binary code RBC may include all bits or lower k bits of the random binary code RBC and the second set of the reference binary code PBC may include all bits or lower k bits of the reference binary code PBC.

The push counter 580 may perform a counting operation to generate counted value in response to a rising edge of the first pick signal PCK1, may increase the counted value in response to receiving a first row address and second row addresses and may generate a second pick signal PCK5 based on the counted value. The first row address may be randomly selected from among first access row addresses from the memory controller 30 during a reference time interval and the second row addresses are consecutively received after the first row address is selected. The push counter 580 may increase the counted value when the first row address is applied and whenever the second row addresses are applied.

The push counter 580 may stop the counting operation to reset the counted value to zero in response to the counted value reaching a maximum value. Therefore, the push counter 580 may output the second pick signal PCK5 with a second logic level when the counted value corresponds to zero or a value corresponding to the maximum value+1 and may output the second pick signal PCK5 with a second logic level when the counted value ranges from one to the maximum value.

The address selector 557 may select the first row address and the second row address in response to the second pick signal PCK5 having a first logic level and may store the selected row addresses in the hammer address queue 600d as candidate hammer addresses CHADDRs. A number of the first row address and the second row addresses may correspond to a size of the hammer address queue 600d.

The hammer address queue 600d may reset previous candidate hammer addresses that are pre-stored in the hammer address queue 600d in response to the first pick signal PCK1 applied to a reset terminal 602 of the hammer address queue 600d and may store the candidate hammer addresses CHADDRs.

The control logic 560c may apply a pop signal POP to the hammer address queue 600d based on the first refresh signal IREF1 indicating first refresh timings based on refresh commands from the memory controller 30 and the refresh management signal RFMS, and may provide the hammer address generation signal HAG to the refresh control circuit 400 in FIG. 3.

The hammer address queue 600d may sequentially provide, or output, the candidate hammer addresses CHADDRs stored therein as the hammer address HADDR to the refresh control circuit 400 in FIG. 3 in response to the pop signal POP. Therefore, the row hammer management circuit 500f of FIG. 18 may store the first row address randomly selected from among the first access row addresses received from the memory controller 30 during the reference time interval and the second row addresses consecutively received after selecting the first row address, in the hammer address queue 600d as the candidate hammer addresses CHADDRs, and may sequentially output the candidate hammer addresses CHADDRs as the hammer address HADDR.

Figure 19:
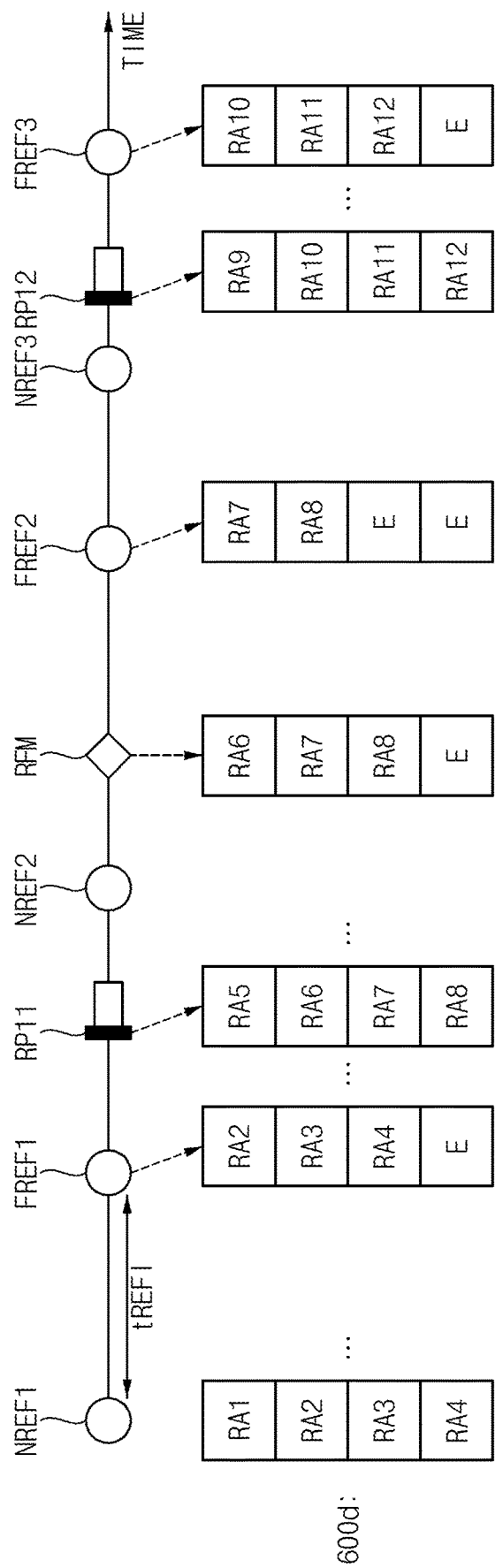
FIG. 19 illustrates an operation of the row hammer management circuit of FIG. 18 according to example embodiments.

FIG. 19 illustrates an operation of the row hammer management circuit of FIG. 18 according to example embodiments. In FIG. 19, normal refresh operations NREF1, NREF2 and NREF3 and hammer refresh operations FREF1, FREF2 and FREF3 are illustrated, each of an interval between the normal refresh operations NREF1, NREF2 and NREF3 and an interval between the hammer refresh operations FREF1, FREF2 and FREF3 corresponds to a refresh interval tREFI of the semiconductor memory device 200 and the refresh interval tREFI may correspond to the reference time interval. In addition, in FIG. 19, the reference "E" represents that a corresponding storage element of the hammer address queue 600d is empty.

Referring to FIG. 19, row addresses RA1, RA2, RA3 and RA4 have been stored in the hammer address queue 600d as candidate hammer addresses before the normal refresh operation NREF1 is performed, and when the row address RA1 is output as the hammer address according to the first-in and first-out scheme, the hammer refresh operation FREF1 is performed on one or more victim memory cell rows which are physically adjacent to a memory cell row designated by the row address RA1.

During a reference time interval between a timing of the hammer refresh operation FREF1 and a timing of the normal refresh operation NREF2, the hammer address queue 600d resets the row addresses RA2, RA3 and RA4 stored therein, in response to the first pick signal PCK1 having a first logic level, and the row hammer management circuit 500f captures row addresses RA5, RA6, RA7 and RA8 that are consecutively received by performing a random pick operation RP11 to store the captured row addresses RA5, RA6, RA7 and RA8 in the hammer address queue 600d as candidate hammer addresses. A refresh management RFM command is received from the memory controller 30 after the normal refresh operation NREF2 is performed and a hammer refresh operation is performed on one or more victim memory cell rows, which are physically adjacent to a memory cell row designated by the row address RA5 (that is output as the hammer address), in response to receiving the refresh management RFM command.

When the row address RA6 is output as the hammer address, the hammer refresh operation FREF2 is performed on one or more victim memory cell rows which are physically adjacent to a memory cell row designated by the row address RA6. And, during a reference time interval between a timing of the normal refresh operation NREF3 and a timing of the hammer refresh operation FREF3, the hammer address queue 600d resets the row addresses RA7 and RA8 stored therein, in response to the first pick signal PCK1 having a first logic level, and the row hammer management circuit 500f captures row addresses RA9, RA10, RA11 and RA12, which are consecutively received by performing a random pick operation RP12 to store the captured row addresses RA9, RA10, RA11 and RA12 in the hammer address queue 600d as candidate hammer addresses. In addition, when the row address RA9 is output as the hammer address, the hammer refresh operation FREF2 is performed on one or more victim memory cell rows which are physically adjacent to a memory cell row designated by the row address RA9.

Figure 20:
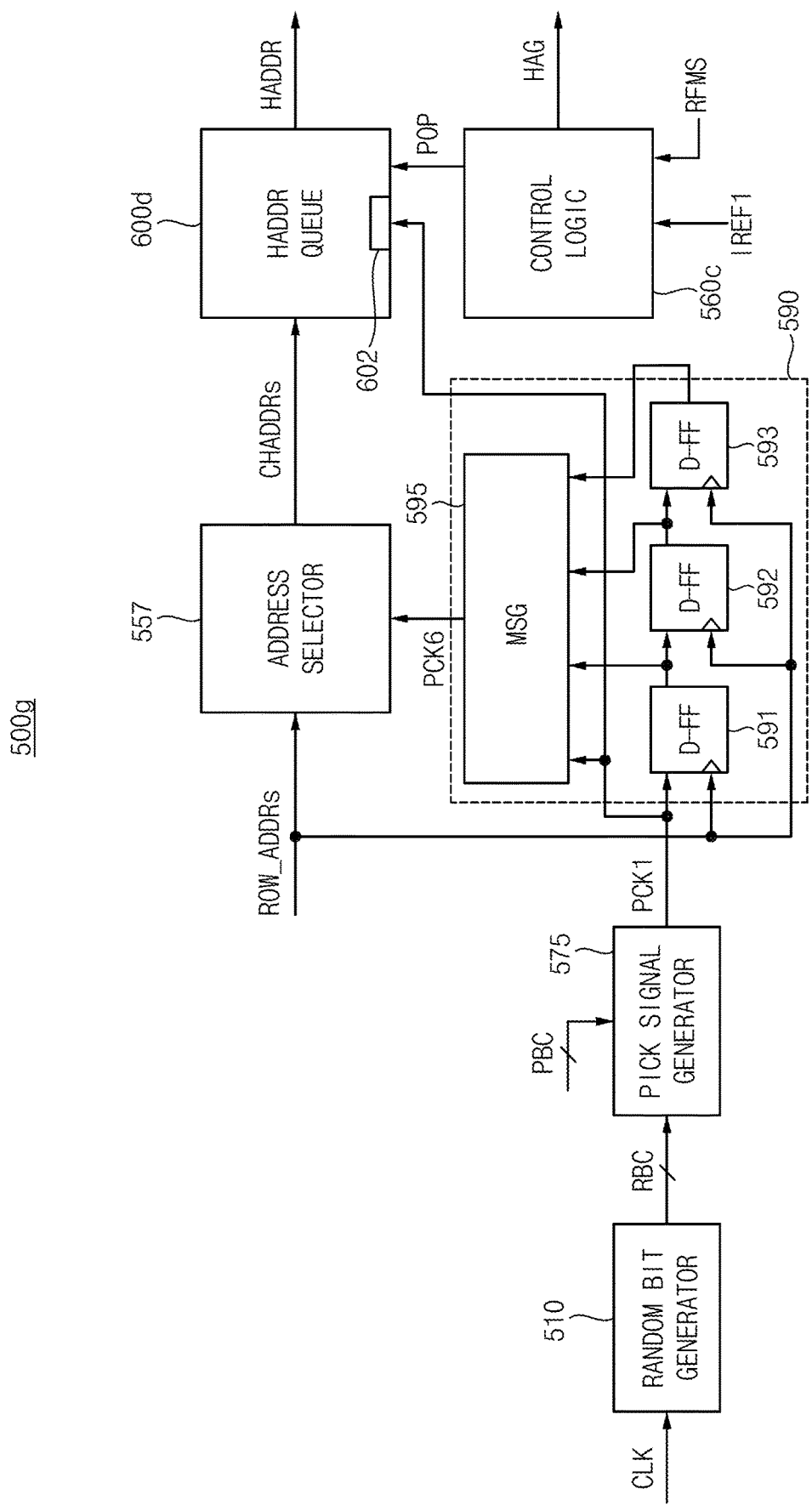
FIG. 20 is a block diagram illustrating an example of the row hammer management circuit in the semiconductor memory device of FIG. 3 according to example embodiments.

FIG. 20 is a block diagram illustrating an example of the row hammer management circuit in the semiconductor memory device of FIG. 3 according to example embodiments. Referring to FIG. 20, a row hammer management circuit 500g may include a random bit generator 510, a pick signal generator 575, an address selector 557, a shift register 590, a control logic 560c and a hammer address queue 600d.

In some embodiments, the random bit generator 510 may generate a random binary code RBC varying randomly, in response to the clock signal CLK and may provide the random binary code RBC to the pick signal generator 575. The pick signal generator 570 may generate a first pick signal PCK1 based on comparing a first set of the random binary code RBC and a second set of a reference binary code PBC. The pick signal generator 570 may output the first pick signal PCK1 with a first logic level in response to the first set of the random binary code RBC matching the second set of the reference binary code PBC and may output the first pick signal PCK1 with a second logic level in response to the first set of the random binary code RBC not matching (being different from) the second set of the reference binary code PBC. The first set of the random binary code RBC may include all bits or lower k bits of the random binary code RBC and the second set of the reference binary code PBC may include all bits or lower k bits of the reference binary code PBC.

The shift register 590 may shift the first pick signal PCK1 in response to receiving a first row address and second row addresses and may generate a second pick signal PCK6 based on the first pick signal PCK1 and the shifted value. The first row address may be randomly selected from among first access row addresses from the memory controller 30 during a reference time interval and the second row addresses are consecutively received after the first row address is selected. The shift register 590 may shift the first pick signal PCK1 when the first row address is applied and whenever the second row addresses are applied.

The shift register 590 may include D flip-flops (D-FF) 591, 592 and 593 and a merged signal generator (MSG) 595. The D flip-flops 591, 592 and 593 may be cascaded-connected and may sequentially shift the first pick signal PCK1 in response to rising edge of the row addresses ROW_ADDRs. The merged signal generator 595 may generate the second pick signal PCK6 by performing a logical OR operation on the first pick signal PCK1 and output of the D flip-flops 591, 592 and 593.

The address selector 557 may select the first row address and the second row address in response to the second pick signal PCK6 having a first logic level and may store the selected row addresses in the hammer address queue 600d as candidate hammer addresses CHADDRs. A number of the first row address and the second row addresses may correspond to a size of the hammer address queue 600d. The hammer address queue 600d may reset previous candidate hammer addresses that are pre-stored in the hammer address queue 600d, in response to the first pick signal PCK1 applied to a reset terminal 602 of the hammer address queue 600d, and may store the candidate hammer addresses CHADDRs.

The control logic 560c may apply a pop signal POP to the hammer address queue 600d based on the first refresh signal IREF1, which indicates first refresh timings based on refresh commands from the memory controller 30 and the refresh management signal RFMS, and may provide the hammer address generation signal HAG to the refresh control circuit 400 in FIG. 3. The hammer address queue 600d may sequentially provide, or output, the candidate hammer addresses CHADDRs stored therein as the hammer address HADDR to the refresh control circuit 400 in FIG. 3 in response to the pop signal POP.

Therefore, the row hammer management circuit 500g of FIG. 20 may store the first row address randomly selected from among the first access row addresses received from the memory controller 30 during the reference time interval and the second row addresses consecutively received after selecting the first row address, in the hammer address queue 600d as the candidate hammer addresses CHADDRs and may sequentially output the candidate hammer addresses CHADDRs as the hammer address HADDR.

Figure 21:
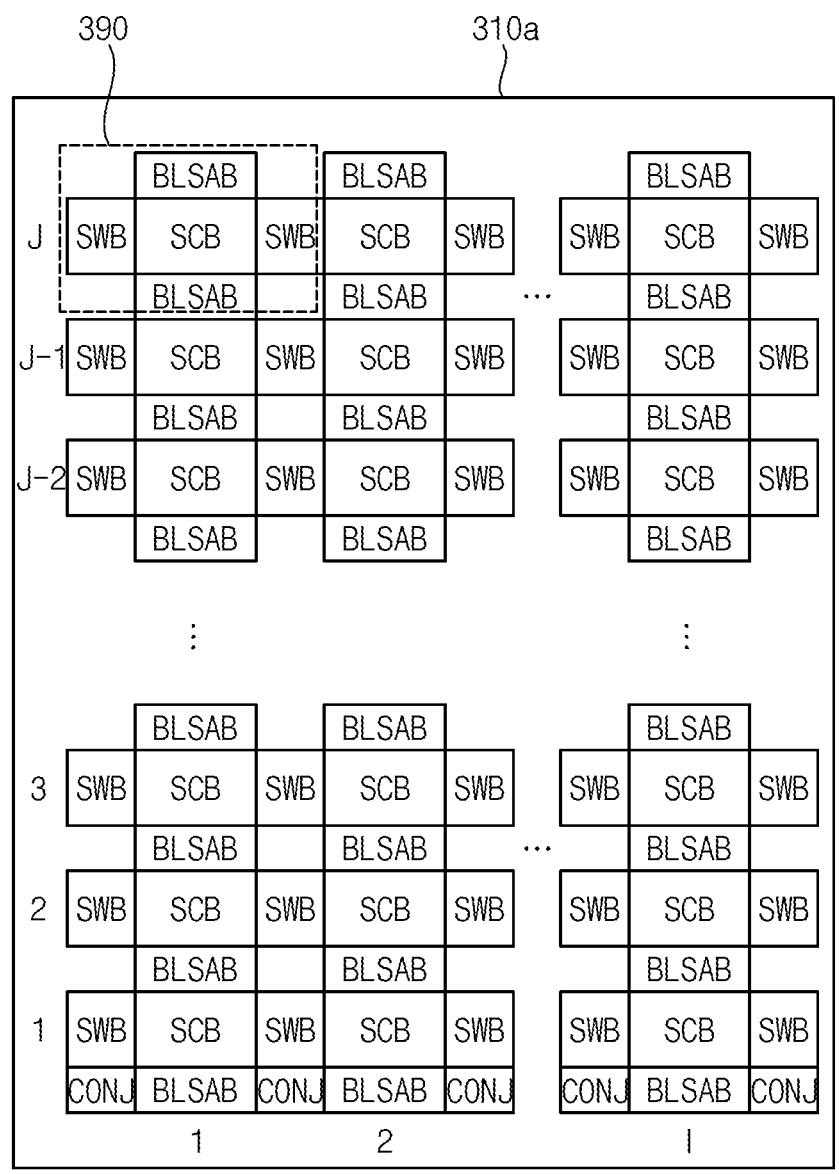
FIG. 21 illustrates an example of the first bank array in the semiconductor memory device of FIG. 3 according to example embodiments.

FIG. 21 illustrates an example of the first bank array in the semiconductor memory device of FIG. 3 according to example embodiments. Referring to FIG. 21, in the first bank array 310a, I sub-array blocks SCB may be disposed in the first direction D1, and J sub-array blocks SCB may be disposed in the second direction D2 substantially perpendicular to the first direction D1. I and J represent a number of the sub-array blocks SCB in the first direction D1 and the second direction D2, respectively, and are natural numbers greater than two.

A plurality of bit-lines, a plurality of word-lines and a plurality of memory cells connected to the bit-lines and the word-lines are disposed in each of the sub-array blocks SCB. I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1. A plurality of conjunction regions CONJ may be disposed adjacent the sub word-line driver regions SWB and the bit-line sense amplifier regions BLSAB. A voltage generator may be disposed in each of the conjunction regions CONJ. A portion 390 in the first bank array 310a may be described with reference to FIG. 22 below.

Figure 22:
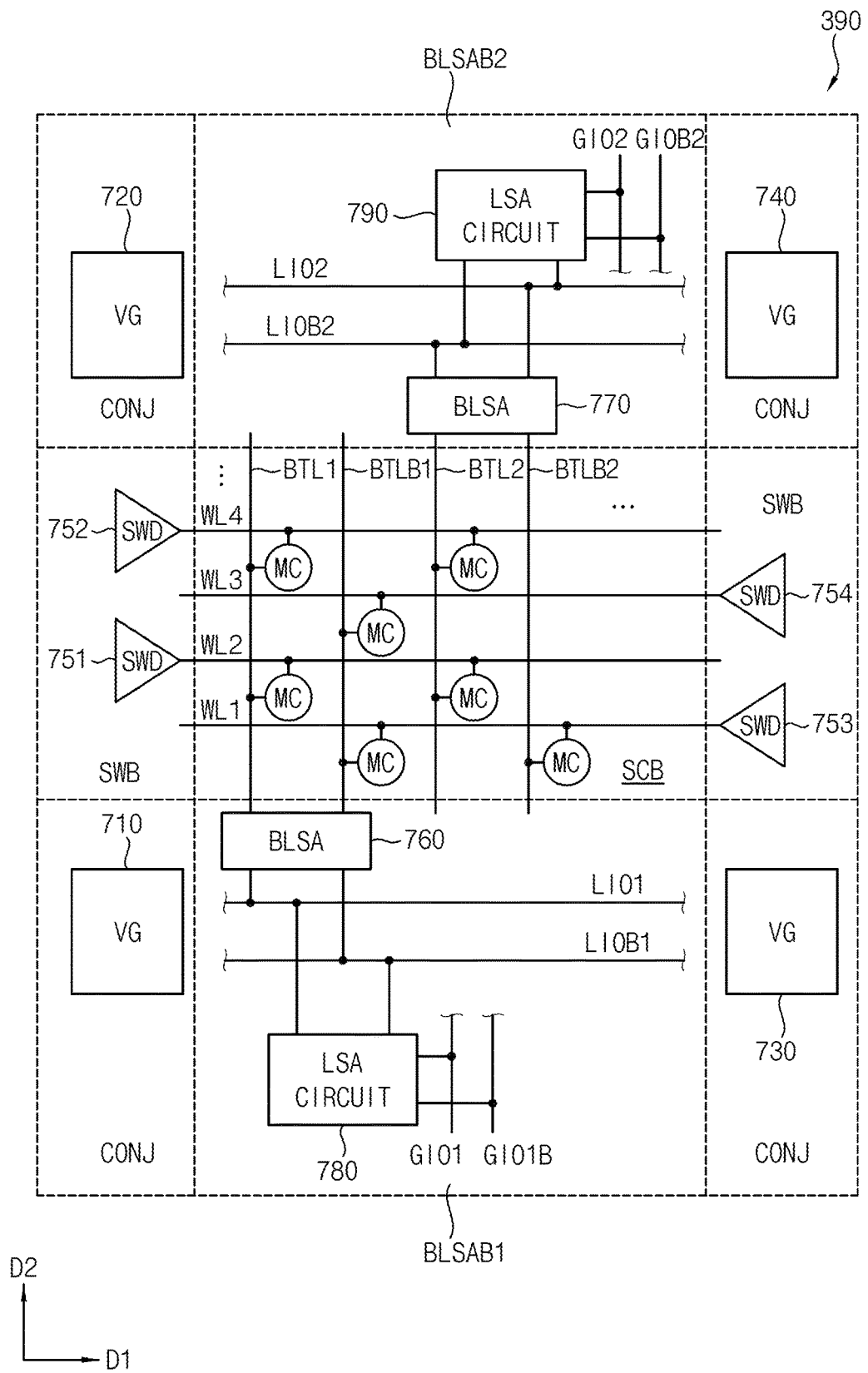
FIG. 22 illustrates a portion of the first bank array in FIG. 21 according to example embodiments.

FIG. 22 illustrates a portion of the first bank array in FIG. 21 according to example embodiments. Referring to FIGS. 21 and 22, in the portion 390 of the first bank array 310a, the sub-array block SCB, two bit-line sense amplifier regions BLSAB1 and BLSAB2, two of the sub word-line driver regions SWB and four of the conjunction regions CONJ are disposed. As shown by FIG. 22, the sub-array block SCB includes a plurality of word-lines WL1~WL4 extending in the first direction D1 and a plurality of bit-line pairs BTL1~BTLB1 and BTL2~BTLB2 extending in the second direction D2. The sub-array block SCB includes a plurality of memory cells MCs disposed at intersections of the word-lines WL1~WL4 and the bit-line pairs BTL1~BTLB1 and BTL2~BTLB2.

With reference to FIG. 22 again, the sub word-line driver regions SWB include a plurality of sub word-line drivers SWDs 751, 752, 753 and 754 that respectively drive the word-lines WL1~WL4. The sub word-line drivers 751 and 752 may be disposed in the sub word-line driver region SWB, which is leftward (in this example), with respect to the sub-array block SCB. In addition, the sub word-line drivers 753 and 754 may be disposed in the sub word-line driver region SWB, which is rightward (in this example), with respect to the sub-array block SCB.

The bit-line sense amplifier regions BLSAB1 and BLSAB2 include a bit-line sense amplifier BLSA 760 and a bit-line sense amplifier 770 coupled to the bit-line pairs BTL1~BTLB1 and BTL2~BTLB2, and a local sense amplifier circuit 780 and a local sense amplifier circuit 790. The bit-line sense amplifier 760 may sense and amplify a voltage difference between the bit-line pair BTL1 and BTLB1 to provide the amplified voltage difference to a local I/O line pair LIO1 and LIOB1. The local sense amplifier circuit 780 may control connection between the local I/O line pair LIO1 and LIOB1 and a global I/O line pair GIO1 and GIOB1. The local sense amplifier circuit 690 may control connection between the local I/O line pair LIO2 and LIOB2 and a global I/O line pair GIO2 and GIOB2.

Referring still to FIG. 22, the bit-line sense amplifier 760 and the bit-line sense amplifier 770 may be alternately disposed at an upper portion and a lower portion of the sub-array block SCB. The conjunction regions CONJ are disposed adjacent to the bit-line sense amplifier regions BLSAB and the sub word-line driver regions SWB. The conjunction regions CONJ are also disposed at each corner of the sub-array block SCB in FIG. 22. A plurality of voltage generators 710, 720, 730 and 740 may be disposed in the conjunction regions CONJ.

FIGS. 23 and 24 illustrate example commands which may be used in the memory system of FIG. 1. FIG. 23 illustrates combinations of a chip selection signal CS_n and first through fourteenth command-address signals CA0~CA13 representing an active command ACT, a write command WR and a read command RD, whereas FIG. 24 illustrates combinations of the chip selection signal CS_n and the first through fourteenth command-address signals CA0~CA13 representing precharge commands PREab, PREsb and PREpb.

In FIGS. 23 and 24, H indicates the logic high level, L indicates the logic low level, V indicates a valid logic level corresponding to one of the logic high level and the logic low level, R0~R17 indicate bits of a row address, BA0 through BA2 indicate bits of a bank address, and CID0 through CID3 indicate die identifier of a memory die when the semiconductor memory device 200 is implemented with a stacked memory device including a plurality of memory dies. In addition, in FIG. 23, C2~C10 indicate bits of a column address, and BL indicates burst length flag.

Referring to FIG. 23, the active command ACT, the write command WR and the read command RD may be transferred during two cycles, for example, during a high level and a low level of the chip selection signal CS_n. The active command ACT a may include the bank address bits BA0 and BA1 and the row address bits R0~R17. And, in FIG. 24, PREpb is a precharge command to precharge a particular bank in a particular bank group, PREab is all bank precharge command to precharge all banks in all bank groups and PREsb is same bank precharge command to precharge same bank in all bank groups.

Figure 25:
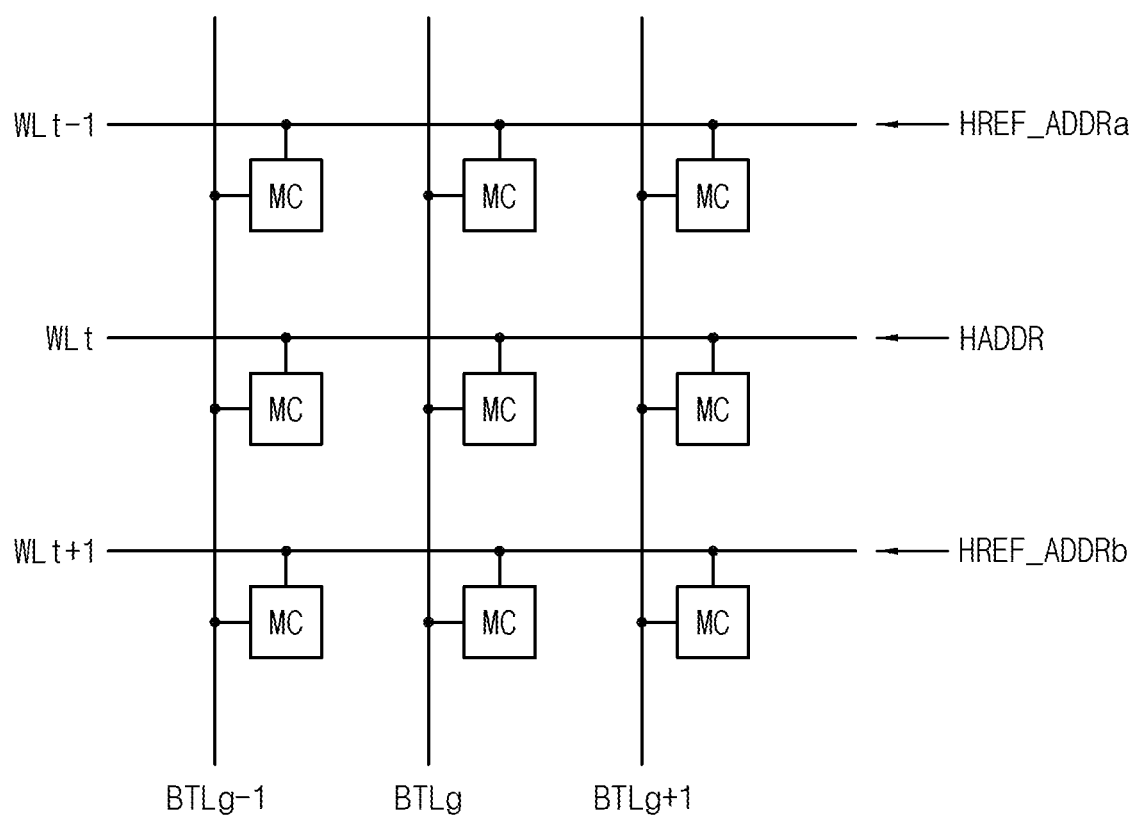
FIG. 25 is a diagram illustrating a portion of a memory cell array for describing generation of hammer refresh addresses.

FIG. 25 is a diagram illustrating a portion of a memory cell array for describing generation of hammer refresh addresses. FIG. 25 illustrates three word-lines WLt−1, WLt and WLt+1, three bit-lines BLg−1, BLg and BLg+1 and memory cells MC coupled to the word-lines WLt−1, WLt and WLt+1 and the bit-lines BLg−1, BLg and BLg+1 in the memory cell array. The three word-lines WLt−1, WLt and WLt+1 are extended in the first direction D1 and arranged sequentially along the second direction D2. The three bit-lines BLg−1, BLg and BLg+1 are extended in the second direction D2 and arranged sequentially along the first direction D1. It will be understood that the word-lines WLt−1 and WLt are physically directly adjacent to each other since there are no intervening word-lines between the word-lines WLt−1 and WLt. For example, the middle word-line WLt may correspond to the hammer address HADDR that has been intensively accessed. It will be understood that "an intensively-accessed word-line" refers to a word-line that has a relatively higher activation number and/or has a relatively higher activation frequency (e.g., relative to a threshold frequency). Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus the cell charges of the memory cells MC coupled to the adjacent word-lines WLt−1 and WLt+1 may be affected. As the hammer word-line WLt is accessed more frequently, the cell charges of the memory cells MC coupled to the adjacent word-lines WLt−1 and WLt+1 may be lost more rapidly.

The hammer refresh address generator 440 in FIG. 5 may provide the hammer refresh address HREF_ADDR representing the addresses HREF_ADDRa and HREF_ADDRb of the rows (e.g., the word-lines WLt−1 and WLt+1) that are physically adjacent to the row of the hammer address HADDR (e.g., the hammer word-line WLt), and an refresh operation for the adjacent word-lines WLt−1 and WLt+1 may be performed additionally based on (e.g., in response to) the hammer refresh address HREF_ADDR to reduce or possibly prevent the loss of data stored in the memory cells MC.

Figure 26:
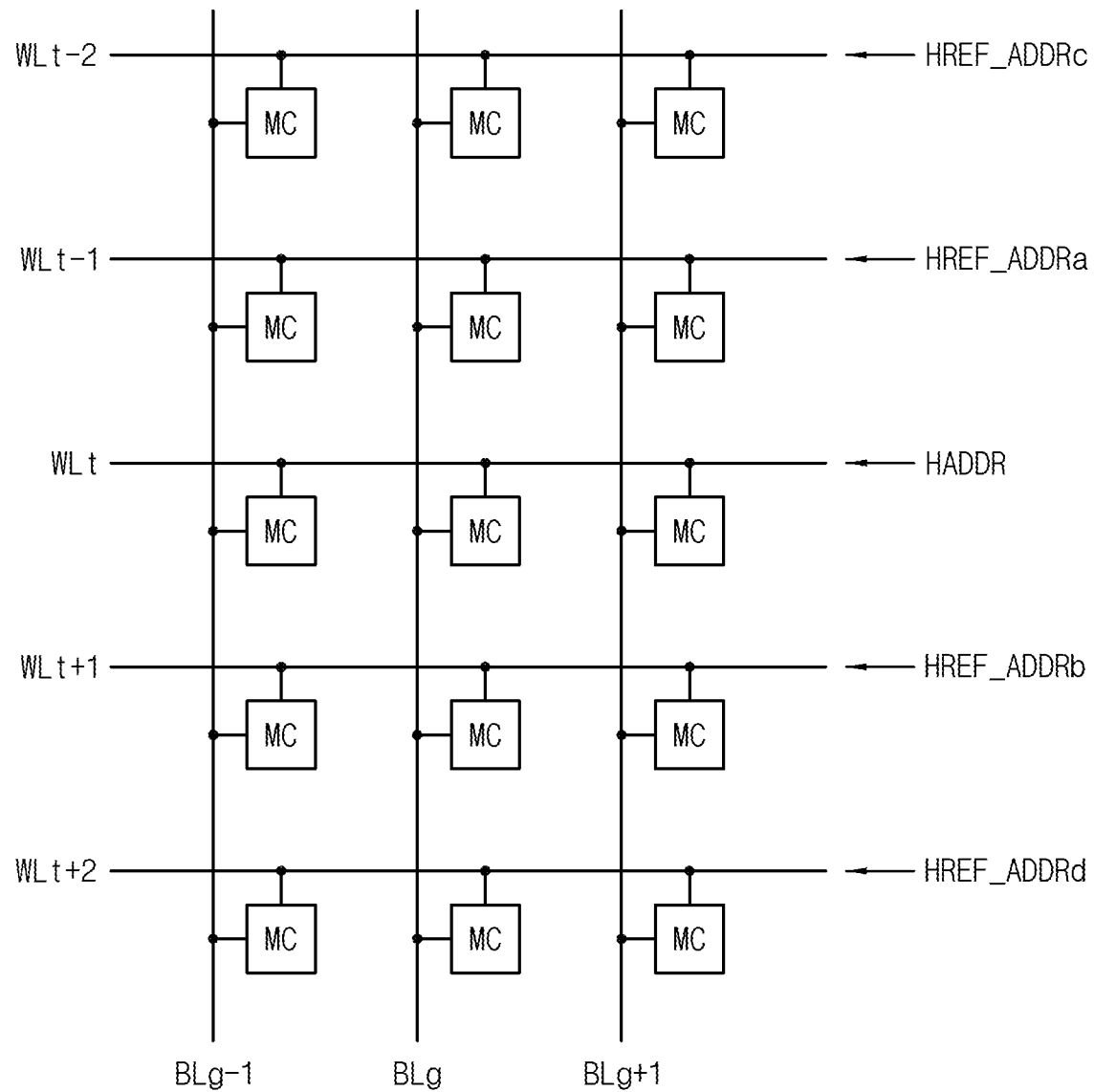
FIG. 26 is a diagram illustrating a portion of a memory cell array for describing generation of hammer refresh addresses.

FIG. 26 is a diagram illustrating a portion of a memory cell array for describing generation of hammer refresh addresses. FIG. 26 illustrates five word-lines WLt−1, WLt, WLt+1 and WLt+2, three bit-lines BLg−1, BLg and BLg+1 and memory cells MC coupled to the word-lines WLt−2, WLt−1, WLt, WLt+1 and WLt+2 and the bit-lines BLg−1, BLg and BLg+1 in the memory cell array. The five word-lines WLt−2, WLt−1, WLt, WLt+1 and WLt+2 are extended in the first direction D1 and arranged sequentially along the second direction D2. The hammer refresh address generator 440 in FIG. 5 may provide the hammer refresh address HREF_ADDR representing addresses HREF_ADDRa, HREF_ADDRb, HREF_ADDRc and HREF_ADDRd of the rows (e.g., the word-lines WLt−1, WLt+1, WLt−2 and WLt+2) that are physically adjacent to the row of the hammer address HADDR (e.g., the middle word-line WLt), and an refresh operation for the adjacent word-lines WLt−1, WLt+1, WLt−2 and WLt+2 may be performed additionally based on (e.g., in response to) the hammer refresh address HREF_ADDR to reduce or possibly prevent the loss of data stored in the memory cells MC.

Figure 27A:
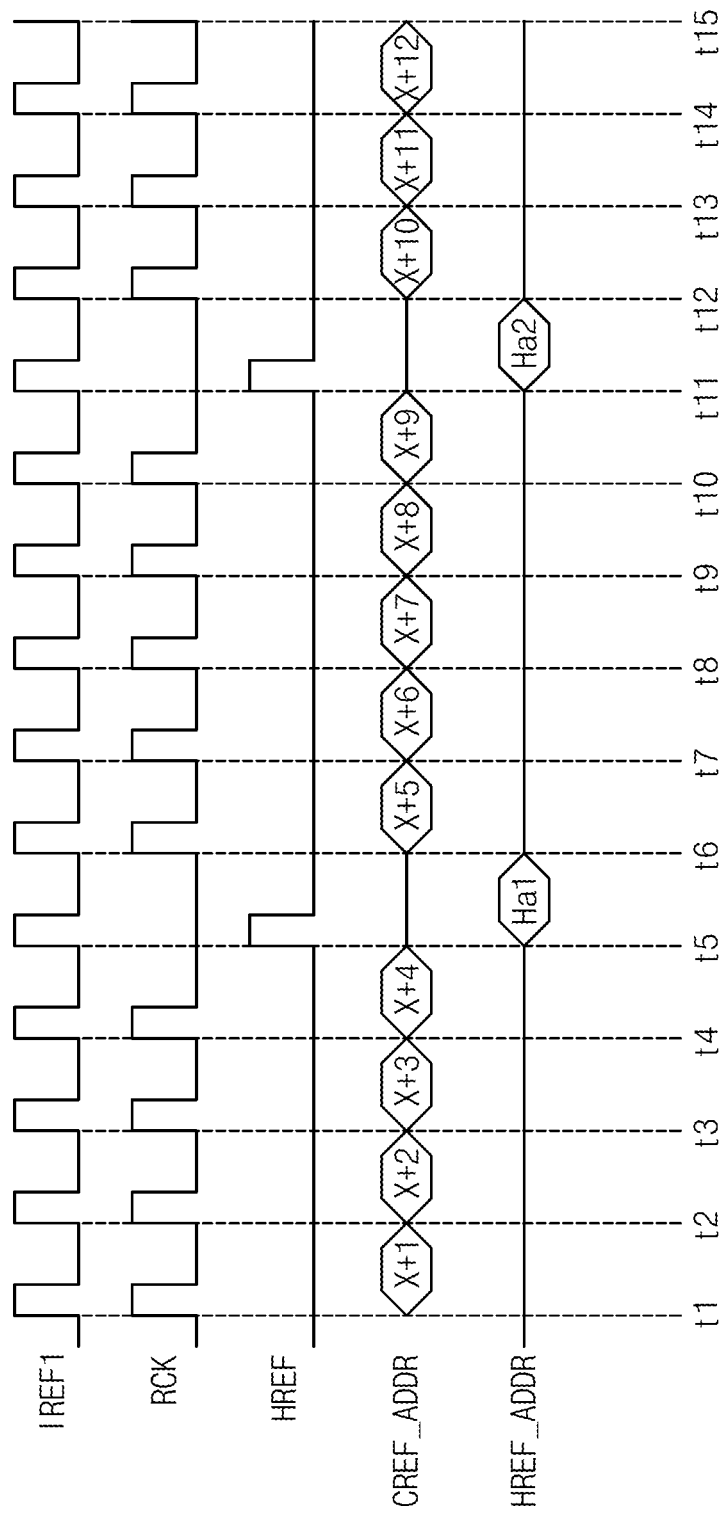
FIGS. 27A, 27B and 28 are timing diagrams illustrating example operations of a refresh control circuit of FIG. 5 according to example embodiments.
Figure 27B:
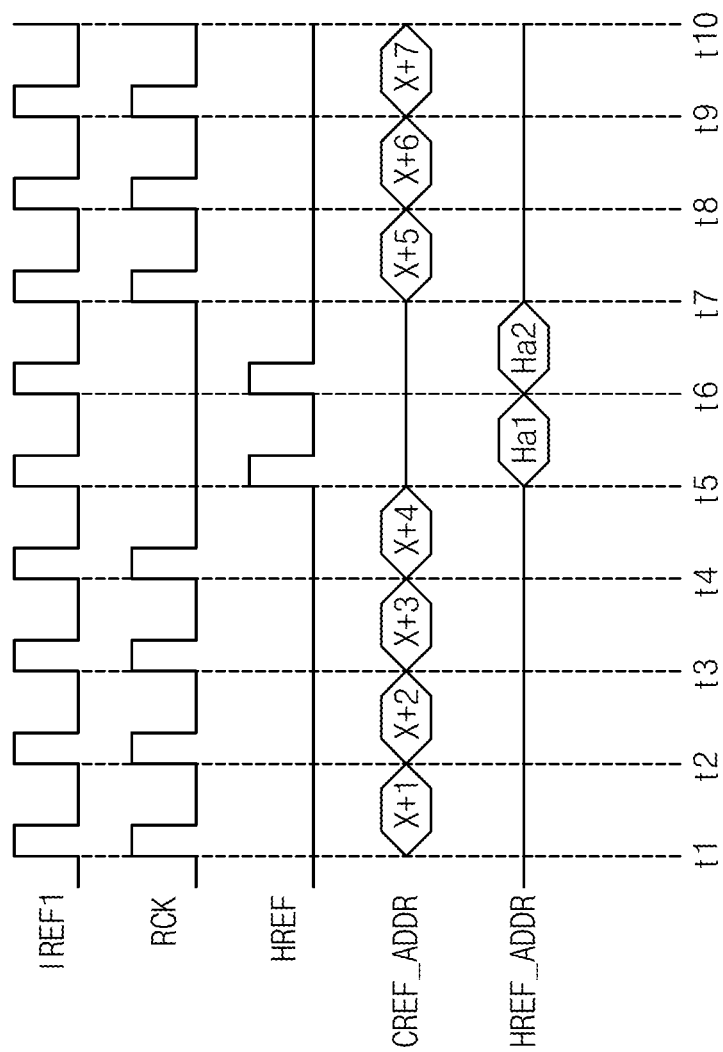
Figure 28:
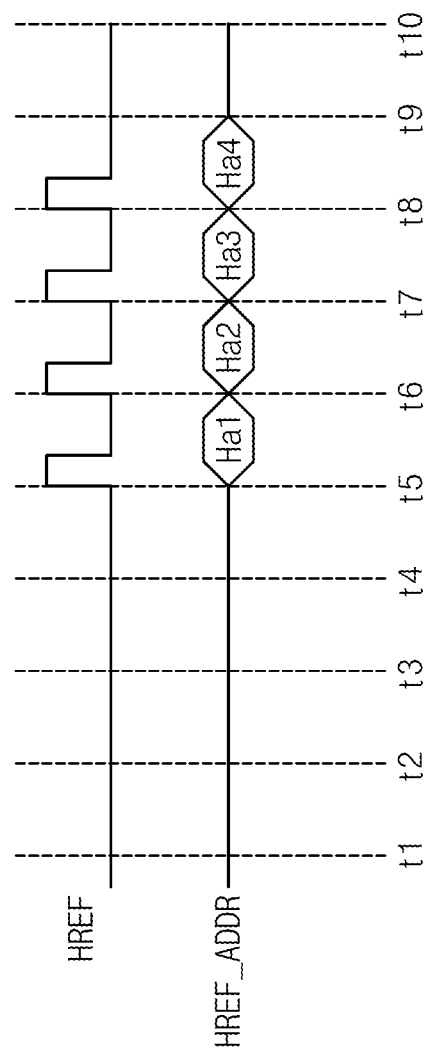

FIGS. 27A, 27B and 28 are timing diagrams illustrating example operations of a refresh control circuit of FIG. 5 according to example embodiments. FIGS. 27A and 27B illustrate generations of a refresh clock signal RCK, a hammer refresh signal HREF, a counter refresh address CREF_ADDR, and a hammer refresh address HREF_ADDR, with respect to the first refresh signal IREF1 that is activated in a pulse shape at activation time points t1~t15 or at activation time points t1~t10. The intervals between the activation time points t1~t15 or the activation time points t1~t10 of the refresh control signal IREF may be regular or irregular.

Referring to FIGS. 5 and 27A, the refresh control logic 410 may activate the refresh clock signal RCK in synchronization with some time points t1~t4, t6~t10 and t12~t15 among the activation time points t1~t15 of the first refresh signal IREF1, and may activate the hammer refresh signal HREF with the other time points t5 and t11.

The refresh counter 430 may generate the counter refresh address CREF_ADDR representing the sequentially changing addresses X+1~X+12 in synchronization with the activation time points t1~t4, t6~t10 and t12~t14 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the hammer refresh signal HREF.

Referring to FIGS. 5 and 27B, the refresh control logic 410 may activate the refresh clock signal RCK in synchronization with some time points t1~t4 and t7~t10 among the activation time points t1~t10 of the first refresh signal IREF1, and may activate the hammer refresh signal HREF with the other time points t5 and t6.

The refresh counter 430 may generate the counter refresh address CREF_ADDR representing the sequentially changing addresses X+1~X+7 in synchronization with the activation time points t1~t4 and t7~t9 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Referring to FIGS. 5 and 28, the hammer refresh address generator 440 may generate the hammer refresh address HREF_ADDR representing the address Ha1, Ha2, Ha3 and Ha4 of the rows that are physically adjacent to the row of the hammer address in synchronization with the activation time points t5, t6, t7, t8 of the hammer refresh signal HREF.

Figure 29:
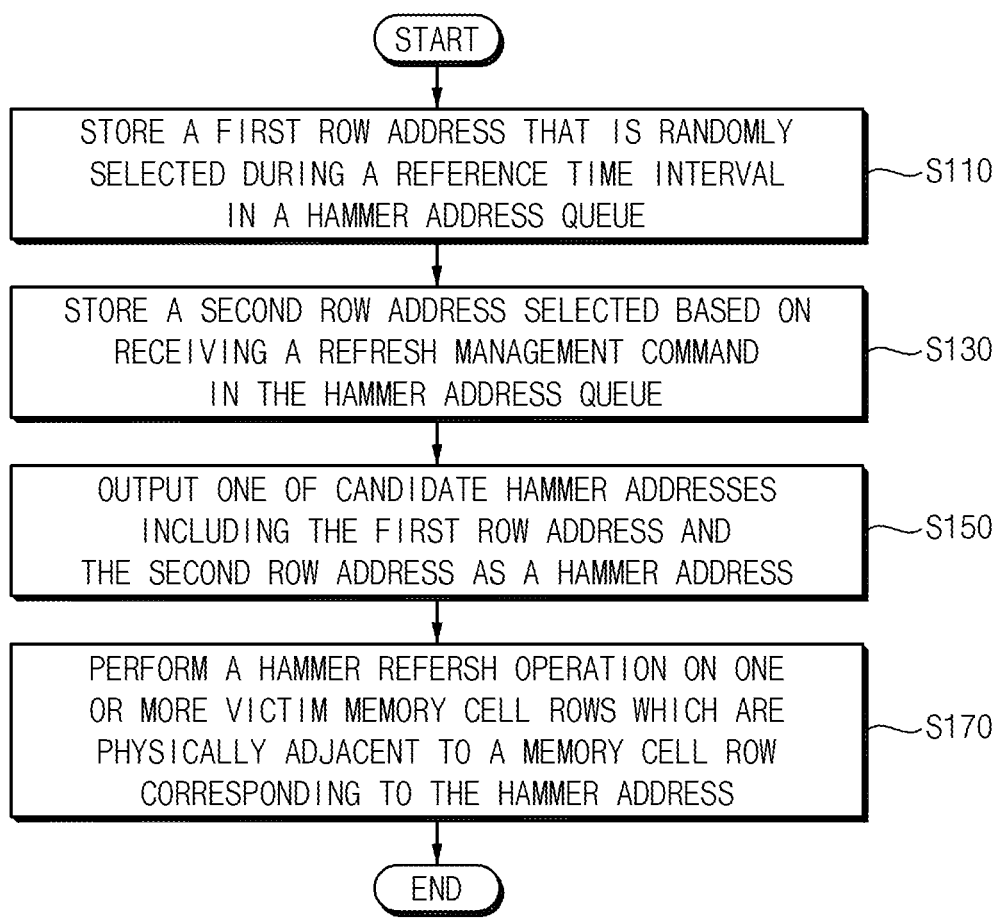
FIG. 29 is a flow chart illustrating a method of operating a semiconductor memory device according to example embodiments.

FIG. 29 is a flow chart illustrating a method of operating a semiconductor memory device according to example embodiments. Referring to FIGS. 3 through 29, in a method of operating a semiconductor memory device including a memory cell array 310 which includes a plurality of memory cell rows and each of the memory cell rows includes a plurality of volatile memory cells, a row hammer management circuit 500 stores a first row address selected from first row addresses received during a reference time interval, in a hammer address queue 600 (operation S1101).

The row hammer management circuit 500 stores a second row address selected based on receiving a refresh management command, in the hammer address queue 600 (operation S1301). Then, the hammer address queue 600 outputs one of candidate hammer addresses including the first row address and the second row address as a hammer address HADDR (operation S150). A refresh control circuit 400 receives the hammer address HADDR, and performs a hammer refresh operation on one or more victim memory cell rows physically adjacent to a memory cell row corresponding to the hammer address HADDR.

Therefore, the semiconductor memory device and the memory system according to example embodiments, performs a hammer refresh operation based on random picks, and forcibly captures a row address received from the memory controller right after receiving the refresh management command or before receiving the refresh management command to store the captured row address in the hammer address queue. Accordingly, the semiconductor memory device and the memory system according to example embodiments may prevent the hammer address queue from being empty and thus may enhance strength of defending row hammer attacks.

Figure 30:
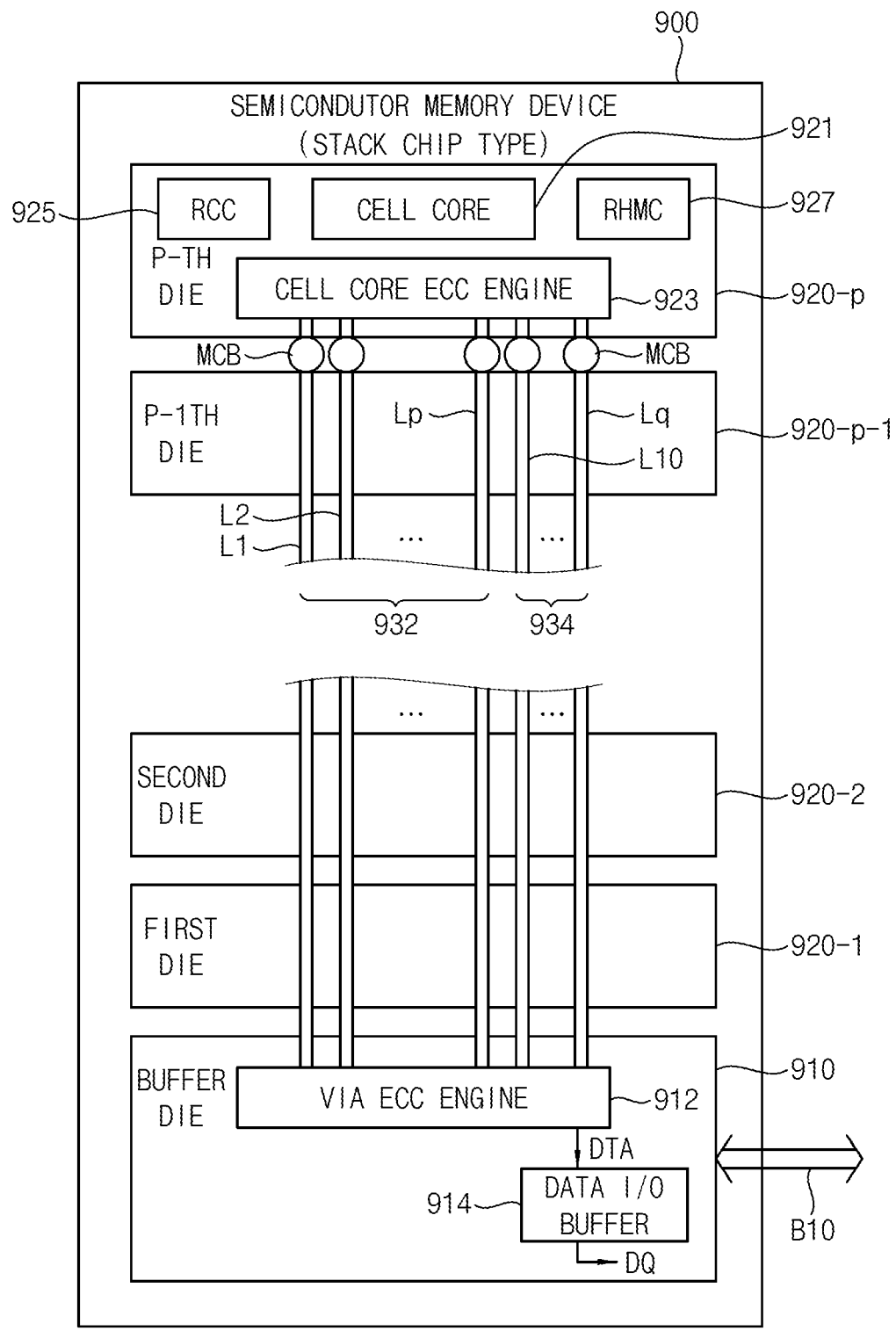
FIG. 30 is a block diagram illustrating a semiconductor memory device according to example embodiments.

FIG. 30 is a block diagram illustrating a multi-die (i.e., multi-chip) semiconductor memory device according to example embodiments. Referring to FIG. 30, a semiconductor memory device 900 may include at least one buffer die 910 and a plurality of memory dies 920-1 to 920-$p$ ($p$ is a natural number equal to or greater than three) providing a soft error analyzing and correcting function in a stacked chip structure. The plurality of memory dies 920-1 to 920-$p$ are stacked on the at least one buffer die 910 and conveys data through a plurality of through silicon via (TSV) lines.

Each of the plurality of memory dies 920-1 to 920-$p$ may include a cell core 921 to store data, a cell core ECC engine 923 which generates transmission parity bits (i.e., transmission parity data) based on transmission data to be sent to the at least one buffer die 910, a refresh control circuit (RCC) 925 and a row hammer management circuit (RHMC) 927. The cell core 921 may include a plurality of memory cells having DRAM cell structure.

The refresh control circuit 925 may employ the refresh control circuit 400 of FIG. 5 and the row hammer management circuit 927 may employ one of the row hammer management circuits 500a, 500b, 500c, 500d, 500e, 500f and 500g. The row hammer management circuit 927 may include a hammer address queue. The row hammer management circuit 927 may receive first access row addresses from the memory controller during a reference time interval, may store a first row address randomly selected from the first access row addresses in the hammer address queue as a first candidate hammer address, may store a second row address received from the memory controller 30 in the hammer address queue as a second candidate hammer address in response to receiving the refresh management command from the memory controller and may sequentially output candidate hammer addresses including the first candidate hammer address and the second candidate hammer address as a hammer address. Alternatively, the row hammer management circuit 927 may receive first access row addresses from the memory controller during the reference time interval. may store a first row address randomly selected from the first access row addresses and second row addresses consecutively received from the memory controller after the first row address in the hammer address queue as candidate hammer addresses, and may sequentially output the candidate hammer addresses as a hammer address.

The refresh control circuit 925 may receive the hammer address from the row hammer management circuit 927 and may perform a hammer refresh operation on one or more victim memory cell rows physically adjacent to a memory cell row corresponding to the hammer address.

The buffer die 910 may include a via ECC engine 912 which corrects a transmission error using the transmission parity bits when a transmission error is detected from the transmission data received through the TSV liens and generates error-corrected data. The buffer die 910 may further include a data I/O buffer 916. The data I/O buffer 916 may generate the data DQ by sampling the data DTA from the via ECC engine 912 and may output the data DQ to an outside.

The semiconductor memory device 900 may be a stack chip type memory device or a stacked memory device which conveys data and control signals through the TSV lines. The TSV lines may be also called 'through electrodes'.

The cell core ECC engine 923 may perform error correction on data which is outputted from the memory die 920-$p$ before the transmission data is sent.

A data TSV line group 932 which is formed at one memory die 920-$p$ may include TSV lines L1, L2, . . . , Lp, and a parity TSV line group 934 may include TSV lines L10 to Lq. The TSV lines L1, L2, . . . , Lp of the data TSV line group 932 and the parity TSV lines L10 to Lq of the parity TSV line group 934 may be connected to micro bumps MCB which are correspondingly formed among the memory dies 920-1 to 920-$p$.

The semiconductor memory device 900 may have a three-dimensional (3D) chip structure or a 2.5D chip structure to communicate with the host through a data bus B10. The buffer die 910 may be connected with the memory controller through the data bus B10. According to example embodiments, and as illustrated in FIG. 30, the cell core ECC engine 923 may be included in the memory die, the via ECC engine 912 may be included in the buffer die. Accordingly, it may be possible to detect and correct soft data fail. The soft data fail may include a transmission error which is generated due to noise when data is transmitted through TSV lines.

Figure 31:
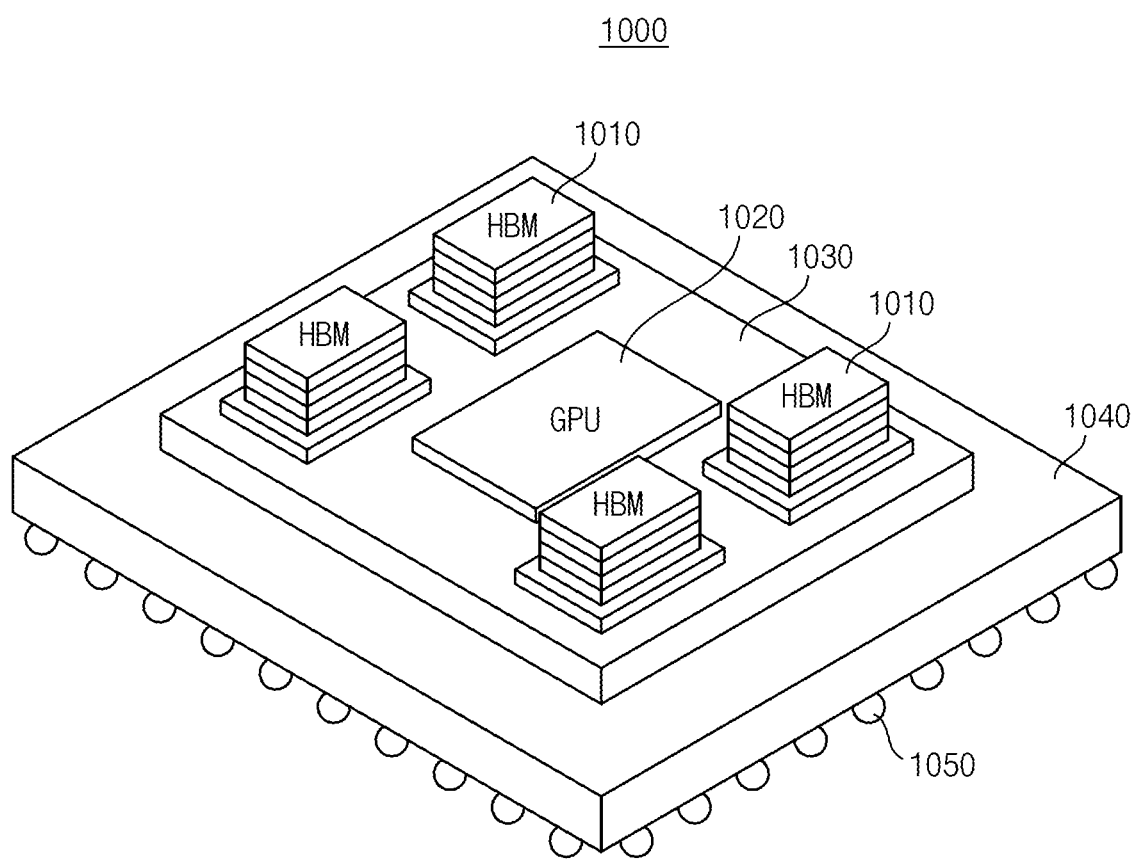
FIG. 31 is a configuration diagram illustrating a semiconductor package including the stacked memory device according to example embodiments.

FIG. 31 is a configuration diagram illustrating a semiconductor package including the stacked memory device according to example embodiments. Referring to FIG. 31, a semiconductor package 1000 may include one or more stacked memory devices 1010 and a graphic processing unit (GPU) 1020.

The stacked memory devices 1010 and the GPU 1020 may be mounted on an interposer 1030, and the interposer on which the stacked memory device 1010 and the GPU 1020 are mounted may be mounted on a package substrate 1040 mounted on solder balls 1050. The GPU 1020 may correspond to a semiconductor device which may perform a memory control function, and for example, the GPU 1020 may be implemented as an application processor (AP). The GPU 1020 may include a memory controller having a scheduler.

The stacked memory device 1010 may be implemented in various forms, and the stacked memory device 1010 may be a memory device in a high bandwidth memory (HBM) form in which a plurality of layers are stacked. Accordingly, the stacked memory device 1010 may include a buffer die and a plurality of memory dies and each of the plurality of memory dies include a refresh control circuit and a row hammer management circuit.

The plurality of stacked memory devices 1010 may be mounted on the interposer 1030, and the GPU 1020 may communicate with the plurality of stacked memory devices 1010. For example, each of the stacked memory devices 1010 and the GPU 1020 may include a physical region, and communication may be performed between the stacked memory devices 1010 and the GPU 1020 through the physical regions. Meanwhile, when the stacked memory device 1010 includes a direct access region, a test signal may be provided into the stacked memory device 1010 through conductive means (e.g., solder balls 1050) mounted under package substrate 1040 and the direct access region.

Aspects of the present disclosure may be applied to systems using semiconductor memory devices that employ volatile memory cells. For example, aspects of the present inventive concept may be applied to systems such as be smart phones, navigation systems, notebook computers, desk top computers and game consoles, which use the semiconductor memory device as a working memory.

The foregoing is illustrative of example embodiments and is not to be construed as limiting thereof. Although some embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device, comprising:
a memory cell array having a plurality of rows of memory cells therein; and
a row hammer management circuit including a hammer address queue therein, the row hammer management circuit configured to:
receive first access row addresses from an external memory controller during a reference time interval;
store a first row address randomly selected from the first access row addresses in the hammer address queue, as a first candidate hammer address;
store a second row address received from the memory controller in the hammer address queue as a second candidate hammer address, in response to receiving a refresh management command from the memory controller; and
sequentially output candidate hammer addresses, which include the first candidate hammer address and the second candidate hammer address, as a hammer address; and
a refresh control circuit configured to: (i) receive the hammer address, and (ii) perform a hammer refresh operation on one or more victim rows of memory cells, which are physically adjacent to a row of memory cells that corresponds to the hammer address at at least a portion of first refresh timings based on a refresh command, and at a second refresh timing based on the refresh management command.

2. The semiconductor memory device of claim 1, wherein the reference time interval corresponds to a refresh interval between refresh cycles of the semiconductor memory device; and wherein the refresh control circuit is configured to perform a refresh operation on one of the plurality of rows of memory cells during one of the refresh cycles.

3. The semiconductor memory device of claim 1,
wherein the row hammer management circuit is configured to:
select one of the first access row addresses as the first row address in response to a first set of a random binary code matching a second set of a reference binary code; and
select a row address received from the memory controller subsequent to receiving the refresh management command as the second row address.

4. The semiconductor memory device of claim 3,
wherein the row hammer management circuit further includes:
a random bit generator configured to generate the random binary code in response to a clock signal;
a first pick signal generator configured to generate a first pick signal based on comparing the first set of the random binary code and the second set of the reference binary code;
a second pick signal generator configured to generate a second pick signal based on a refresh management signal, which is generated based on the refresh management command;
a merged signal generator configured to generate a third pick signal by performing a logical OR operation on the first pick signal and the second pick signal;
an address selector configured to: (i) select one of the first access row addresses and the second row address, based on the third pick signal, and (ii) store the selected row addresses in the hammer address queue as the candidate hammer addresses; and a control logic configured to apply a pop signal to the hammer address queue based on a first refresh signal, which indicates the first refresh timings; and wherein the hammer address queue is configured to output the hammer address in response to the pop signal.

5. The semiconductor memory device of claim 4, wherein the first pick signal generator is configured to output the first pick signal with a first logic level in response to the first set of the random binary code matching the second set of the reference binary code;

wherein the second pick signal generator is configured to output the second pick signal with a first logic level in response to the refresh management signal being activated; and wherein the address selector is configured to store the selected row addresses in the hammer address queue as the candidate hammer addresses in response to the third pick signal having a first logic level.

6. The semiconductor memory device of claim 3, wherein the row hammer management circuit further includes:
  a random bit generator configured to generate the random binary code in response to a clock signal;
  a first pick signal generator configured to generate a first pick signal based on comparing the first set of the random binary code and the second set of the reference binary code;
  a second pick signal generator configured to generate a second pick signal based on a refresh management signal, which is generated based on the refresh management command;
  a merged signal generator configured to generate a third pick signal by performing a logical OR operation on the first pick signal and the second pick signal; and
  a control logic configured to apply a pop signal to the hammer address queue based on a first refresh signal, which indicates the first refresh timings; and wherein the hammer address queue is configured store one of the first access row addresses and the second row address in the hammer address queue as the candidate hammer addresses in response to the third pick signal, and is further configured to output the hammer address in response to the pop signal.

7. The semiconductor memory device of claim 1, wherein the row hammer management circuit is configured to:
  select one of the first access row addresses as the first row address in response to a first set of a random binary code matching a second set of a reference binary code; and
  select at least one row address received from the memory controller before receiving the refresh management command.

8. The semiconductor memory device of claim 7, wherein the row hammer management circuit further includes:
  a random bit generator configured to generate the random binary code in response to a clock signal;
  a first pick signal generator configured to generate a first pick signal based on comparing the first set of the random binary code and the second set of the reference binary code;
  a second pick signal generator configured to generate a second pick signal based on a refresh management signal that is generated based on the refresh management command;
  a merged signal generator configured to generate a third pick signal by performing a logical OR operation on the first pick signal and the second pick signal;
  a latch configured to store one of the first access row addresses and the second row address, and further configured to provide the stored row addresses to the hammer address queue; and
  a control logic configured to apply a pop signal to the hammer address queue based on a first refresh signal, which indicates the first refresh timings; and wherein the hammer address queue is configured to: (i) selectively store the row addresses provided from the latch as the candidate hammer addresses based on the third pick signal, and (ii) output the hammer address in response to the pop signal.

9. The semiconductor memory device of claim 8, wherein the first pick signal generator is configured to output the first pick signal with a first logic level in response to the first set of the random binary code matching the second set of the reference binary code; and wherein the second pick signal generator is configured to output the second pick signal having a first logic level in response to the refresh management signal being activated; and wherein the hammer address queue is configured to store the row addresses provided from the latch as the candidate hammer addresses, in response to the third pick signal having a first logic level.

10. The semiconductor memory device of claim 1, wherein the row hammer management circuit is configured to:
  select one of the first access row addresses as the first row address in response to a first set of a random binary code matching a second set of a reference binary code; and
  adjust a number of bits in the first set of the random binary code based on a state of the refresh management command.

11. The semiconductor memory device of claim 10, wherein the row hammer management circuit further includes:
  a random bit generator configured to generate the random binary code in response to a clock signal;
  a pick signal generator configured to generate a first pick signal based on comparing the first set of the random binary code and the second set of the reference binary code;
  a refresh management command status estimator configured to provide the pick signal generator with a pick ratio control signal for adjusting the number of bits in the first set based on a refresh management signal, which is generated based on the refresh management command;
  an address selector configured to: (i) select one of the first access row addresses and the second row address based on the first pick signal, and (ii) store the selected row addresses in the hammer address queue as the candidate hammer addresses; and
  control logic configured to apply a pop signal to the hammer address queue based on a first refresh signal that indicates the first refresh timings; and wherein the hammer address queue is configured to output the hammer address in response to the pop signal.

12. The semiconductor memory device of claim 11, wherein refresh command state estimator is configured to generate the pick ratio control signal such that: (i) the number of bits in the first set decreases in response to the refresh management signal being activated, and (ii) the number of bits in the first set increases in response to the refresh management signal being deactivated.

13. The semiconductor memory device of claim 10,
wherein the row hammer management circuit further includes:
   a random bit generator configured to generate the random binary code in response to a clock signal;
   a pick signal generator configured to generate a first pick signal based on comparing the first set of the random binary code and the second set of the reference binary code;
   a refresh management command status estimator configured to provide the pick signal generator with a pick ratio control signal for adjusting the number of bits in the first set based on a refresh management signal that is generated based on the refresh management command; and
   a control logic configured to apply a pop signal to the hammer address queue based on a first refresh signal indicating the first refresh timings; and
   wherein the hammer address queue is configured to: (i) store one of the first access row addresses and the second row address in the hammer address queue as the candidate hammer addresses in response to first pick signal, and (ii) output the hammer address in response to the pop signal.

14. The semiconductor memory device of claim 1, wherein the hammer address queue includes a first-in and first-out (FIFO) register.

15. The semiconductor memory device of claim 1, wherein the hammer address queue includes a last-in and first-out (LIFO) stack.

16. The semiconductor memory device of claim 1,
wherein the refresh control circuit includes:
   a refresh control logic configured to generate a hammer refresh signal in response to a hammer address generation signal from the row hammer management circuit;
   a refresh clock generator configured to generate a refresh clock signal in response to a refresh signal;
   a refresh counter configured to generate a count refresh address associated with a normal refresh operation on the plurality of memory cell rows;
   hammer address storage configured to store the hammer address and configured to output the hammer address in response to the hammer refresh signal; and
   a mapper configured to generate hammer refresh addresses designating addresses of the victim memory cell rows, based on the hammer address output from the hammer address storage.

17. A semiconductor memory device, comprising:
a memory cell array including a plurality of rows of memory cells therein; and
a row hammer management circuit including a hammer address queue therein, the row hammer management circuit configured to:
   receive first access row addresses from an external memory controller during a reference time interval;
   store a first row address randomly selected from the first access row addresses and second row addresses consecutively received from the memory controller after selecting the first row address, in the hammer address queue as candidate hammer addresses; and
   sequentially output the candidate hammer addresses as a hammer address; and
a refresh control circuit configured to receive the hammer address and to perform a hammer refresh operation on one or more victim memory cell rows, which are physically adjacent to a memory cell row corresponding to the hammer address, at least a portion of first refresh timings based on a refresh command, and at a second refresh timing based on a refresh management command received from the memory controller subsequent to the reference time interval.

18. The semiconductor memory device of claim 17, wherein the row hammer management circuit is configured to reset previous candidate hammer addresses that are pre-stored in the hammer address queue, in response to a first set of a random binary code matching a second set of a reference binary code; and wherein a number of the first row address and the second row addresses corresponds to a size of the hammer address queue.

19. The semiconductor memory device of claim 18,
wherein the row hammer management circuit further includes:
   a random bit generator configured to generate the random binary code in response to a clock signal;
   a pick signal generator configured to generate a first pick signal based on comparing the first set of the random binary code and the second set of the reference binary code;
   a push counter configured to: (i) perform a counting operation to generate counted value in response to a rising edge of the first pick signal, (ii) increase the counted value in response to receiving the first row address and the second row addresses, and (iii) generate a second pick signal based on the counted value;
   an address selector configured to select the first row address and the second row addresses based on the second pick signal; and
   control logic configured to apply a pop signal to the hammer address queue based on a first refresh signal indicating the first refresh timings; and
   wherein the hammer address queue is configured to reset the previous candidate hammer addresses, which are pre-stored in the hammer address queue, in response to the first pick signal having a first logic level, and is further configured to output the hammer address in response to the pop signal.

20. A memory system, comprising:
a memory controller; and
a semiconductor memory device, including:
   a memory cell array including a plurality of memory cell rows, each including a plurality of memory cells;
   a row hammer management circuit including a hammer address queue, the row hammer management circuit is configured to:
      receive first access row addresses from an external memory controller during a reference time interval;
      store a first row address randomly selected from the first access row addresses in the hammer address queue as a first candidate hammer address;
      store a second row address received from the memory controller in the hammer address queue as a second candidate hammer address in response to receiving a refresh management command from the memory controller; and sequentially output candidate hammer addresses including the first candidate hammer address and the second candidate hammer address as a hammer address; and a refresh control circuit configured to receive the hammer address and to perform a hammer refresh operation on one or more victim memory cell rows which are physically adjacent to a memory cell row corresponding to the hammer address;

wherein the memory controller is configured to apply the refresh management command to the semiconductor memory device aperiodically;

wherein the reference time interval corresponds to a refresh interval between refresh cycles of the semiconductor memory device; and wherein the row hammer management circuit is configured to select one of the first access row addresses as the first row address in response to a first set of a random binary code matching a second set of a reference binary code.

* * * * *